(12) United States Patent
Kim et al.

(10) Patent No.: US 12,324,290 B2
(45) Date of Patent: Jun. 3, 2025

(54) DISPLAY DEVICE

(71) Applicant: LG ELECTRONICS INC., Seoul (KR)

(72) Inventors: Jungsub Kim, Seoul (KR); Changseo Park, Seoul (KR); Gunho Kim, Seoul (KR); Yongil Shin, Seoul (KR); Yoonchul Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/697,320

(22) PCT Filed: Sep. 30, 2021

(86) PCT No.: PCT/KR2021/013433
§ 371 (c)(1),
(2) Date: Mar. 29, 2024

(87) PCT Pub. No.: WO2023/054764
PCT Pub. Date: Apr. 6, 2023

(65) Prior Publication Data
US 2024/0332475 A1    Oct. 3, 2024

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC ... H01L 33/62; H01L 25/0753; H01L 25/075; H01L 27/15; H10H 20/857; H10H 20/83;
(Continued)

(56) References Cited

U.S. PATENT DOCUMENTS 11,791,447 B2 * 10/2023 Lee .................... H01L 33/60
257/91
2013/0027623 A1    1/2013 Negishi et al.
(Continued)

FOREIGN PATENT DOCUMENTS

KR    10-2012-0138805 A    12/2012
KR    10-2018-0007376 A    1/2018
(Continued)

OTHER PUBLICATIONS

The International Search Report (PCT/ISA/210) issued in PCT/KR2021/013433, dated Jun. 21, 2022.

*Primary Examiner* — Ratisha Mehta
(74) *Attorney, Agent, or Firm* — Birch, Stewart, Kolasch & Birch, LLP

(57) ABSTRACT

The display device includes a substrate, first assembly wiring, second assembly wiring, a partition, and first to third semiconductor light emitting devices. Each of the plurality of pixels includes first to third sub-pixels. The first to third assembly holes are located in the first to third sub-pixels. The first assembly wiring includes a first bus wiring in a plurality of pixels, and a plurality of first branch wirings branching from the first bus wiring. The second assembly wiring includes a second bus wiring in a plurality of pixels, and a plurality of second branch wirings branching from the second bus wiring. Each of the first to third semiconductor light emitting devices may be disposed in first to third assembly holes between the first bus wiring, the second bus wiring, the first branch wiring, and the second branch wiring.

17 Claims, 14 Drawing Sheets

(58) Field of Classification Search
CPC ...... H10H 20/85; H10H 29/10; H10H 29/142; H10D 86/441
See application file for complete search history.

(56) References Cited

U.S. PATENT DOCUMENTS

| | | |
|---|---|---|
| 2018/0019369 A1 | 1/2018 | Cho et al. |
| 2019/0244985 A1 | 8/2019 | Kim et al. |
| 2020/0395345 A1 | 12/2020 | Park et al. |
| 2021/0265541 A1 | 8/2021 | Kim et al. |
| 2021/0335883 A1* | 10/2021 | Park .................. G09G 3/32 |
| 2022/0351993 A1 | 11/2022 | Jeong et al. |
| 2023/0023582 A1 | 1/2023 | Park et al. |

FOREIGN PATENT DOCUMENTS

| | | |
|---|---|---|
| KR | 10-2019-0095638 A | 8/2019 |
| KR | 10-2020-0026673 A | 3/2020 |
| KR | 10-2020-0026781 A | 3/2020 |
| KR | 10-2020-0028350 A | 3/2020 |
| KR | 10-2105466 B1 | 4/2020 |
| KR | 10-2173349 B1 | 11/2020 |

\* cited by examiner

[FIG. 1]
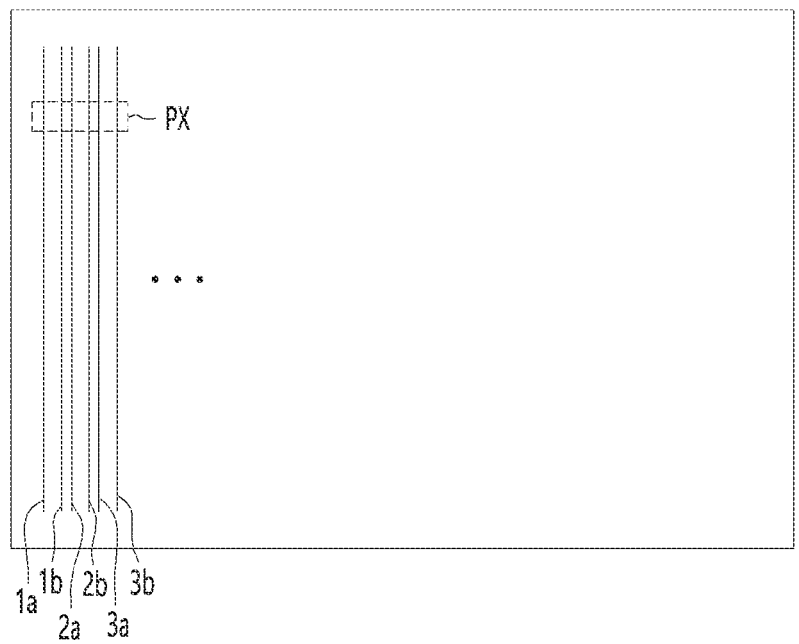
[FIG. 2]
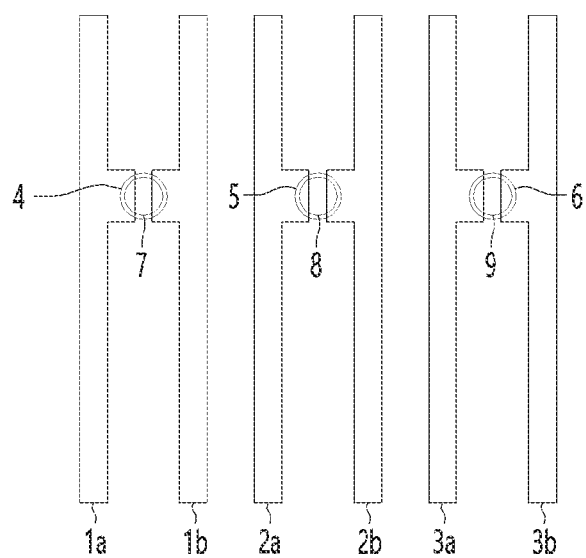

[FIG. 3]
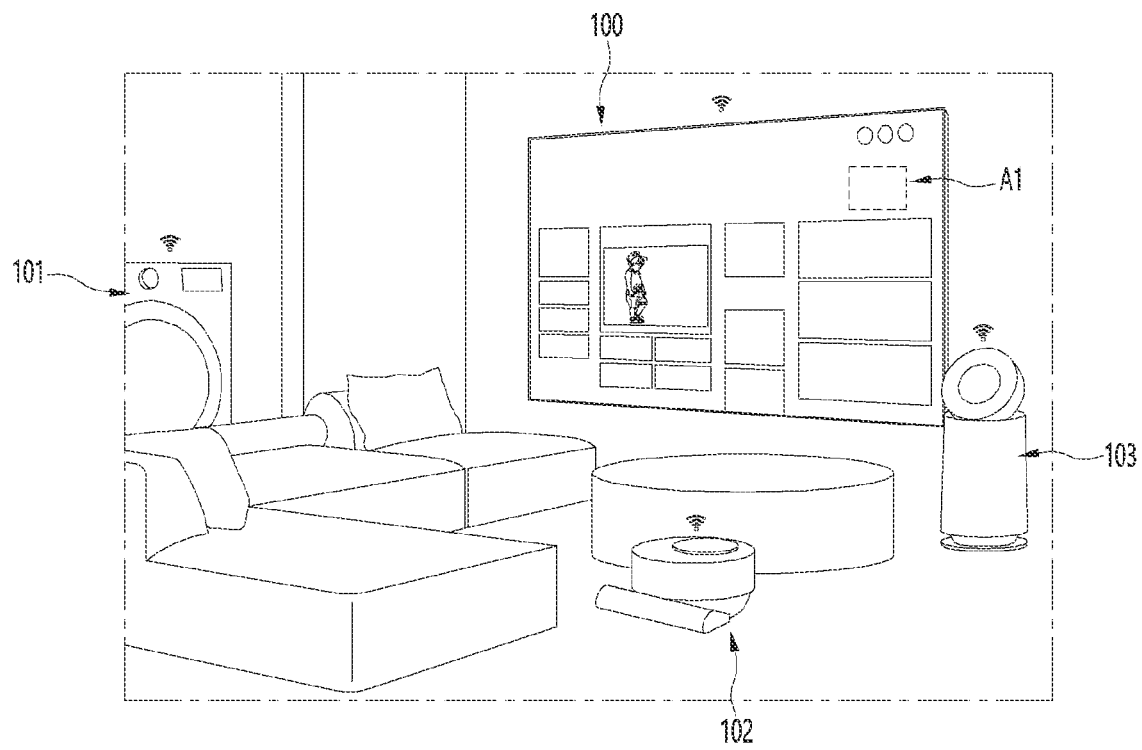

[FIG. 4]
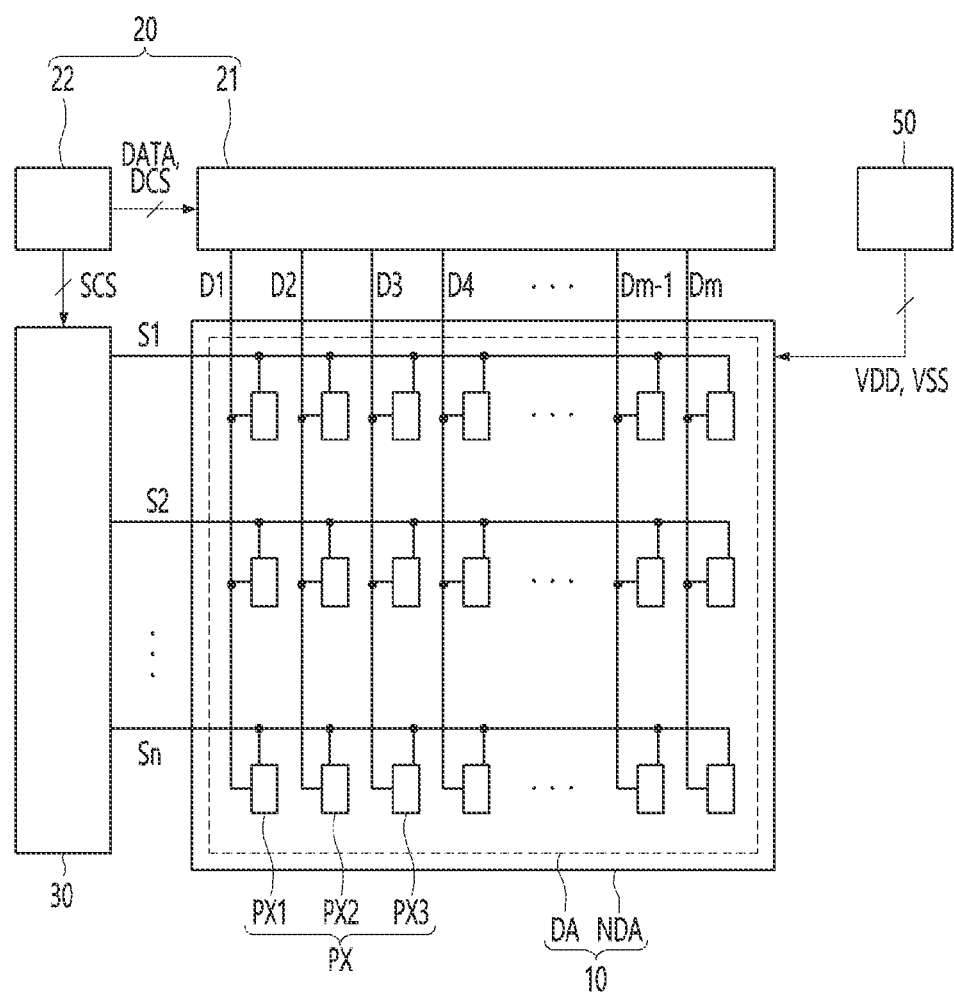

[FIG. 5]
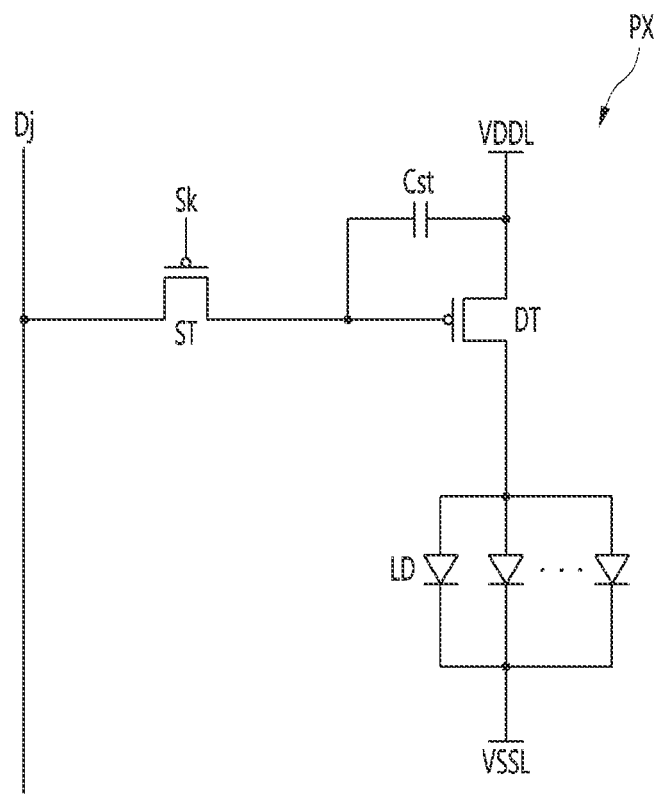

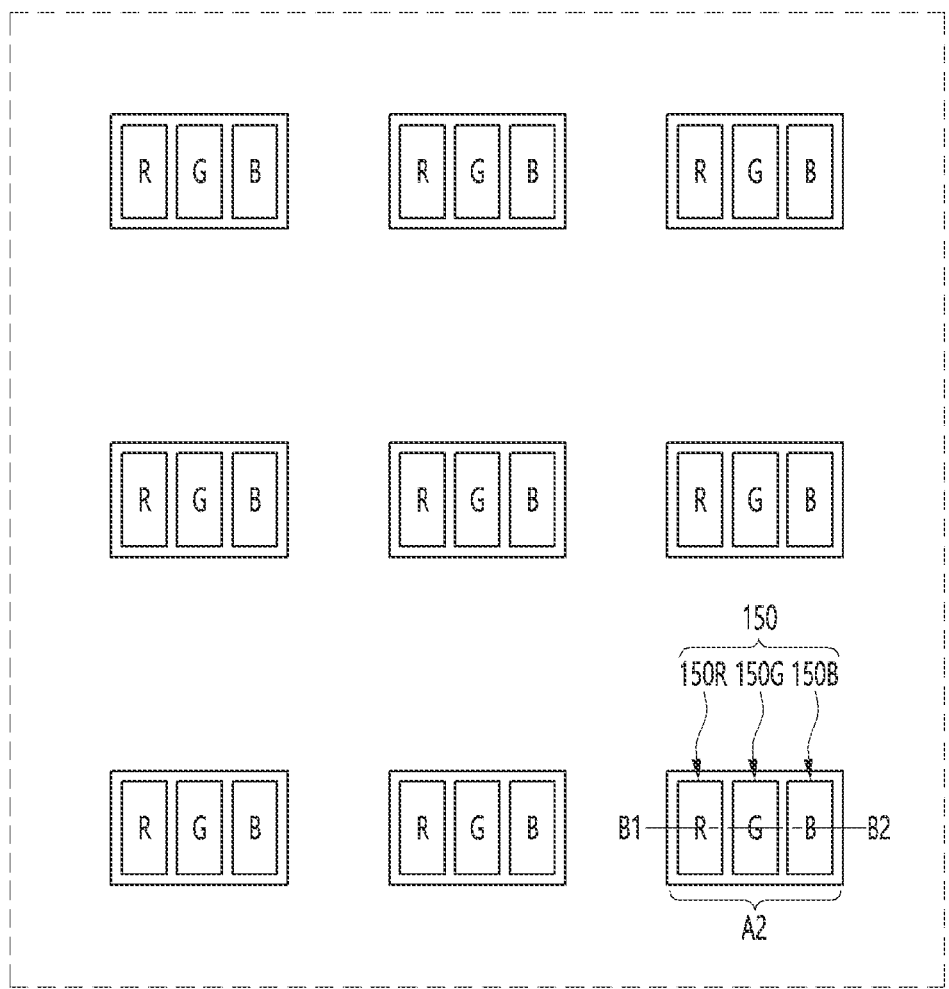
[FIG. 6]

[FIG. 7]
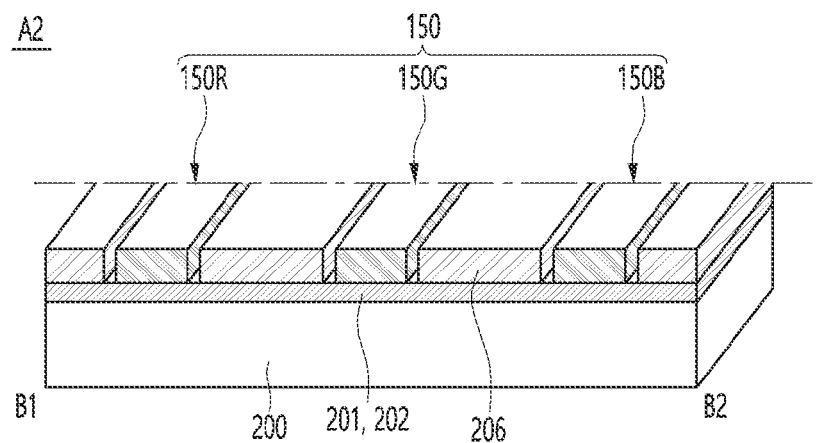
[FIG. 8]
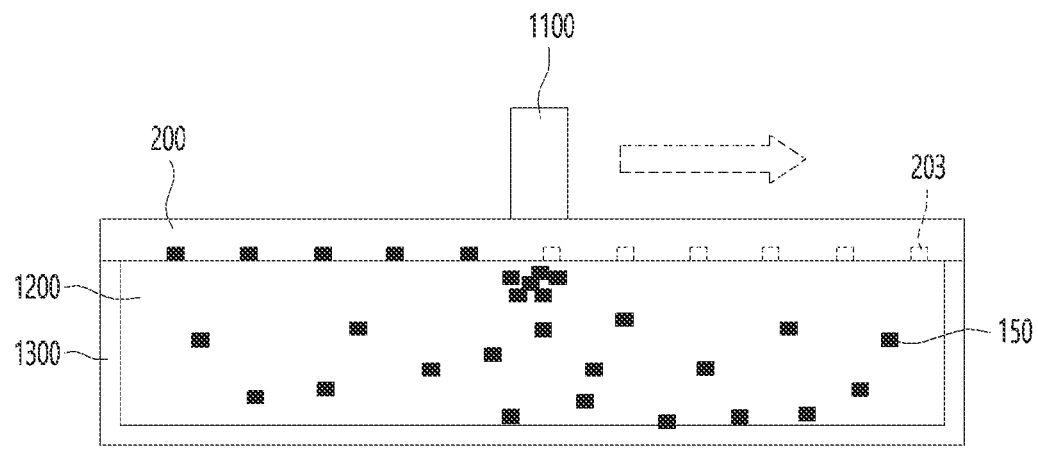

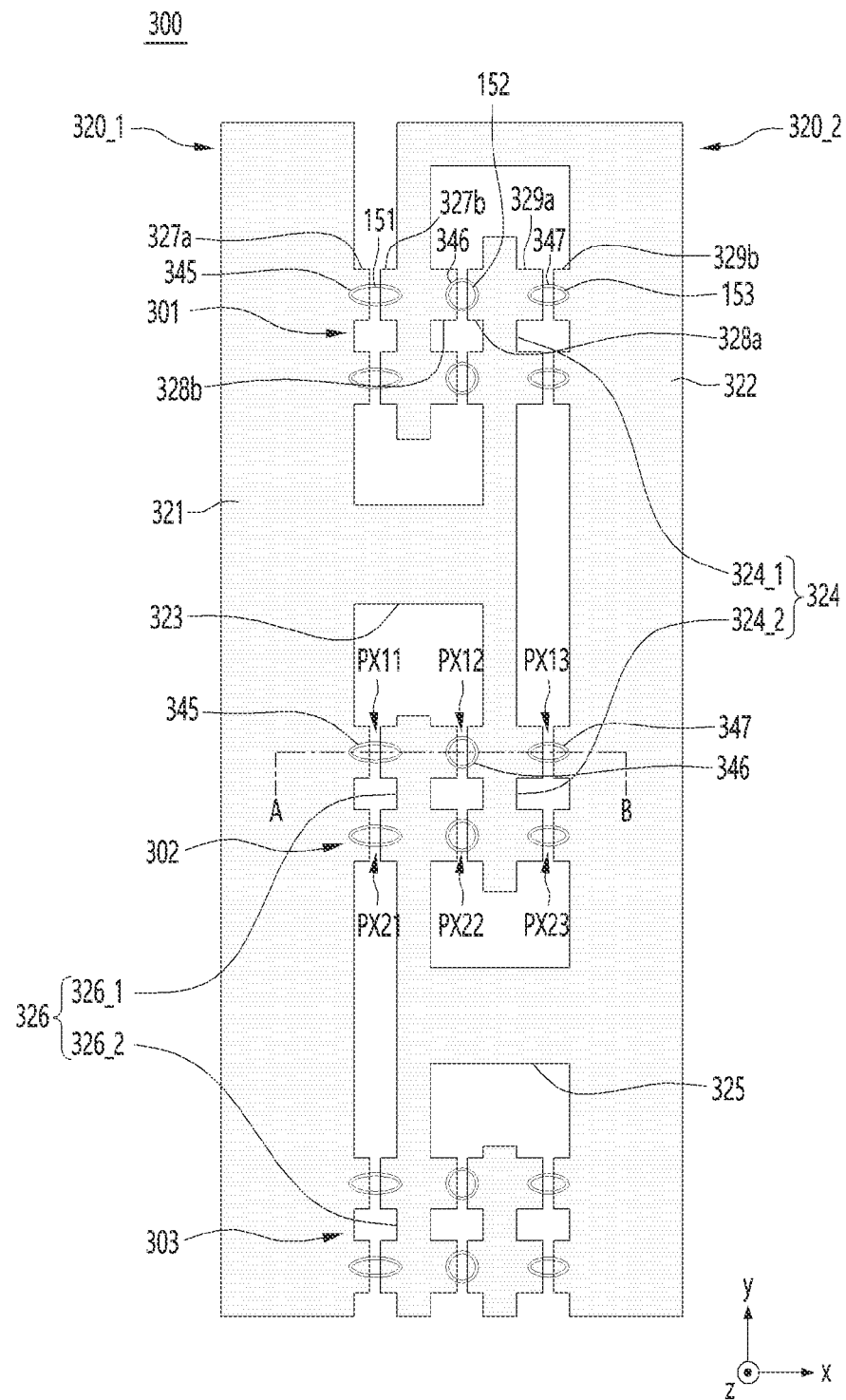
[FIG. 9]

[FIG. 10]
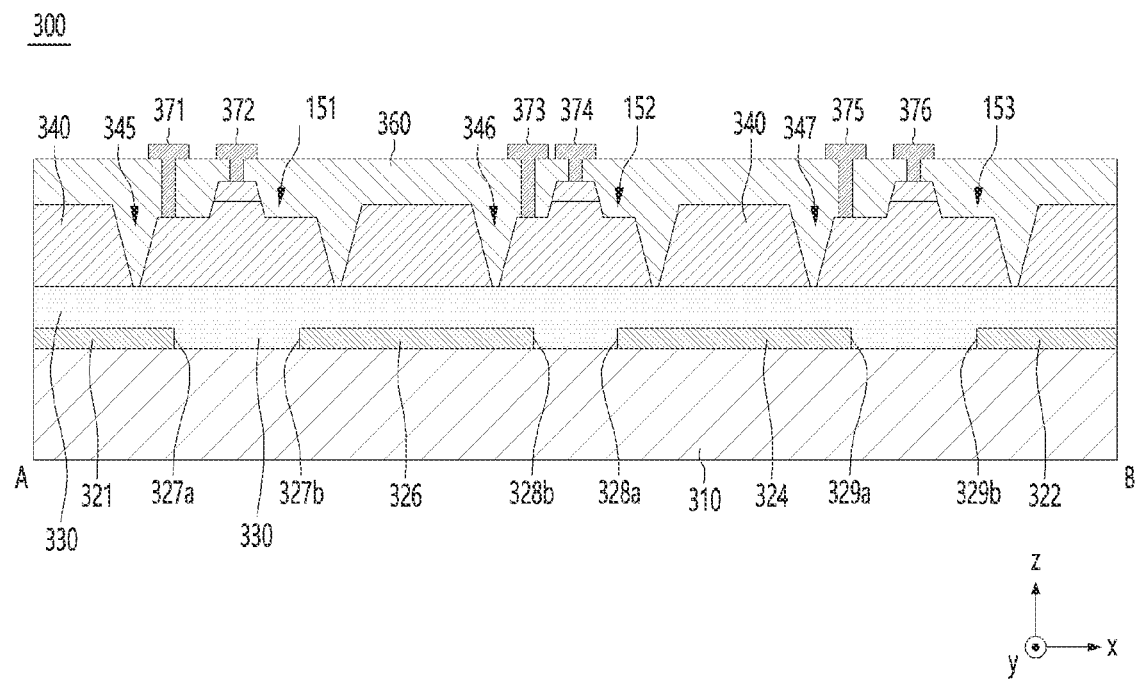
[FIG. 11]
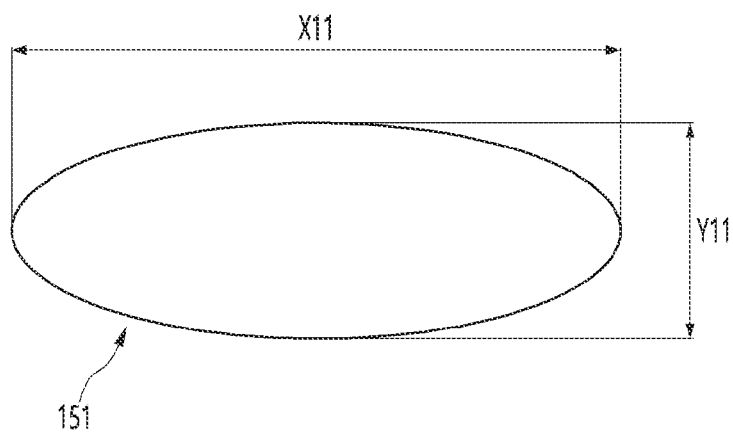

[FIG. 12]
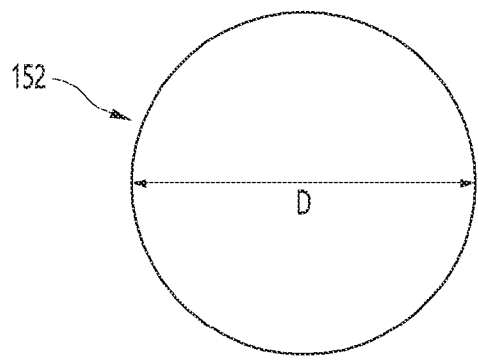
[FIG. 13]
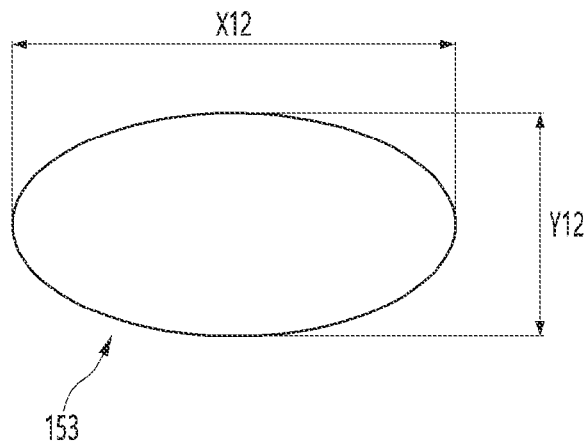

[FIG. 14]
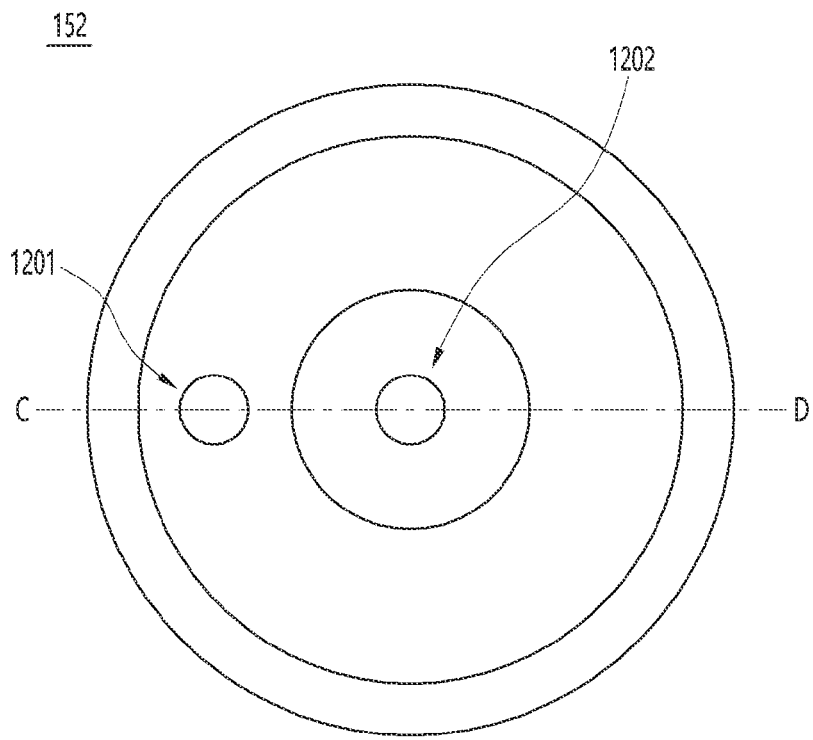
[FIG. 15]
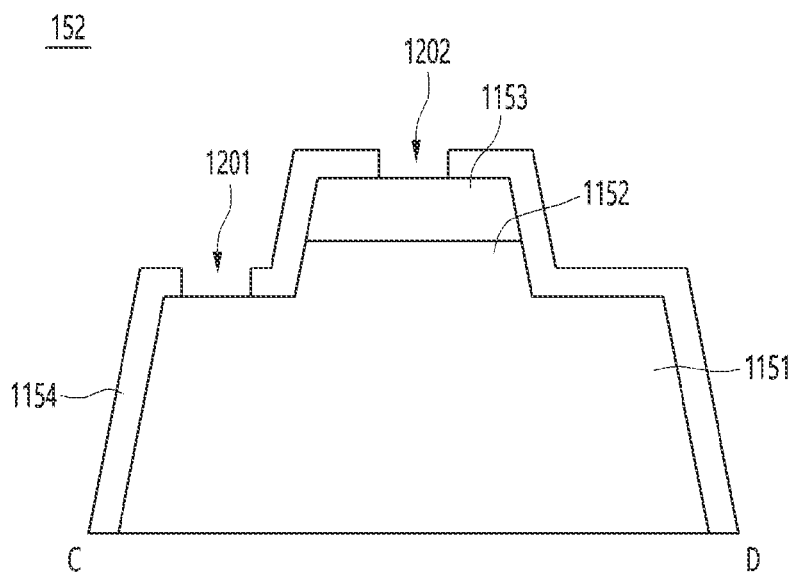

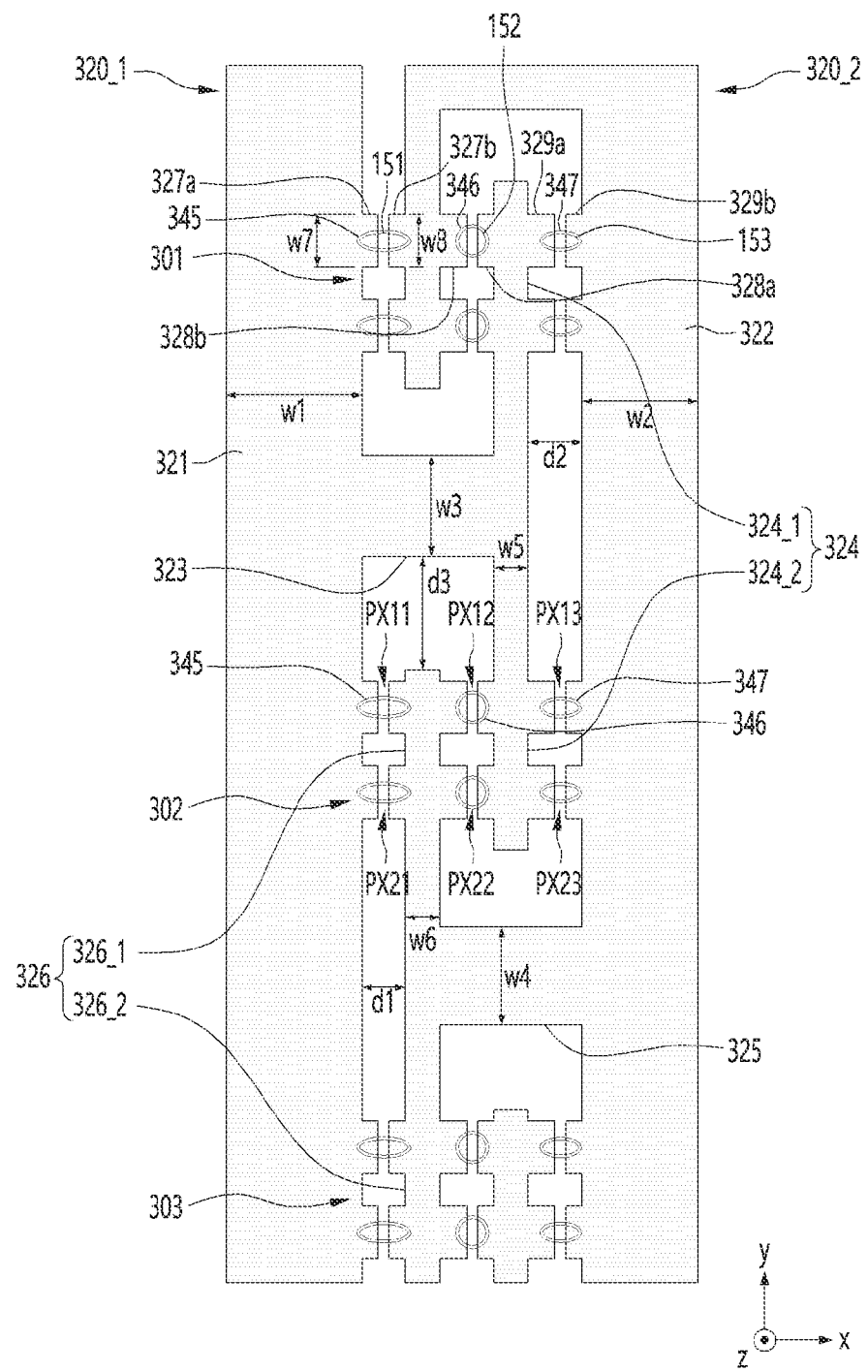
[FIG. 16]

[FIG. 17]
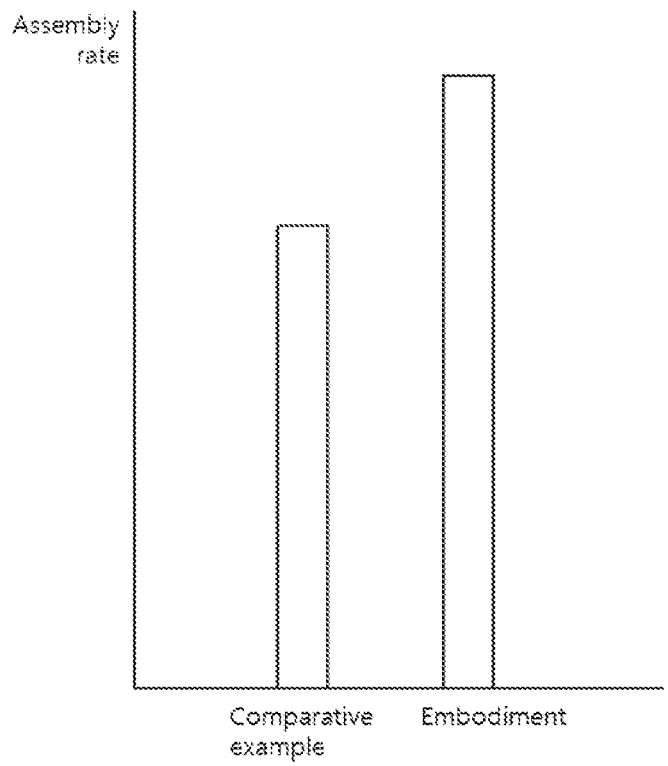
[FIG. 18]
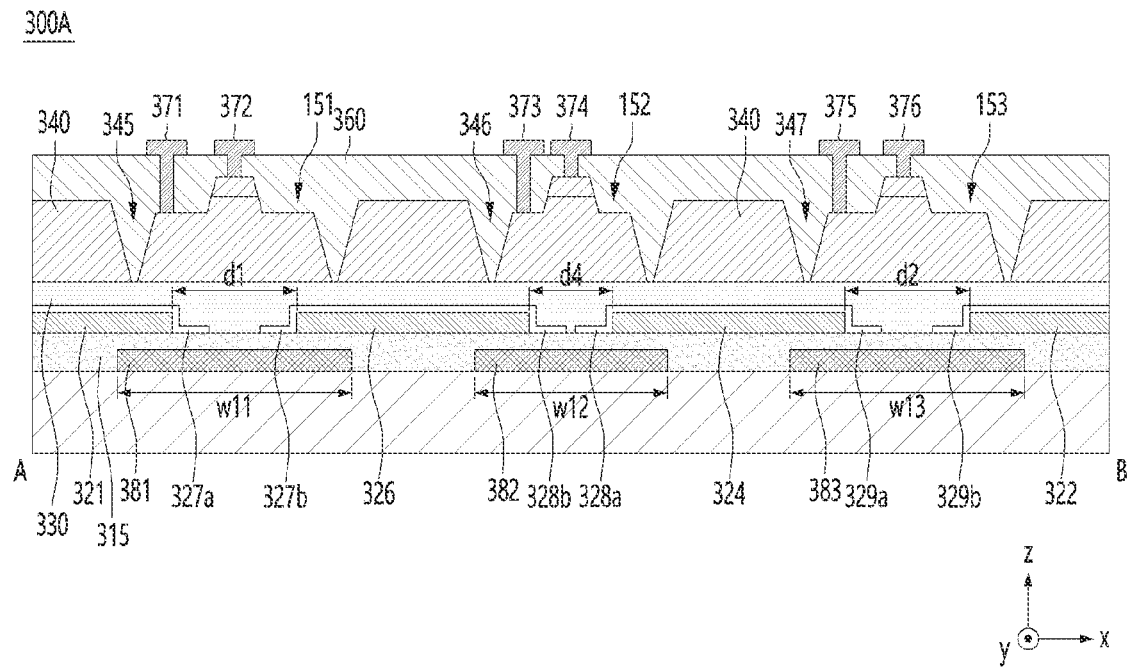

[FIG. 19]
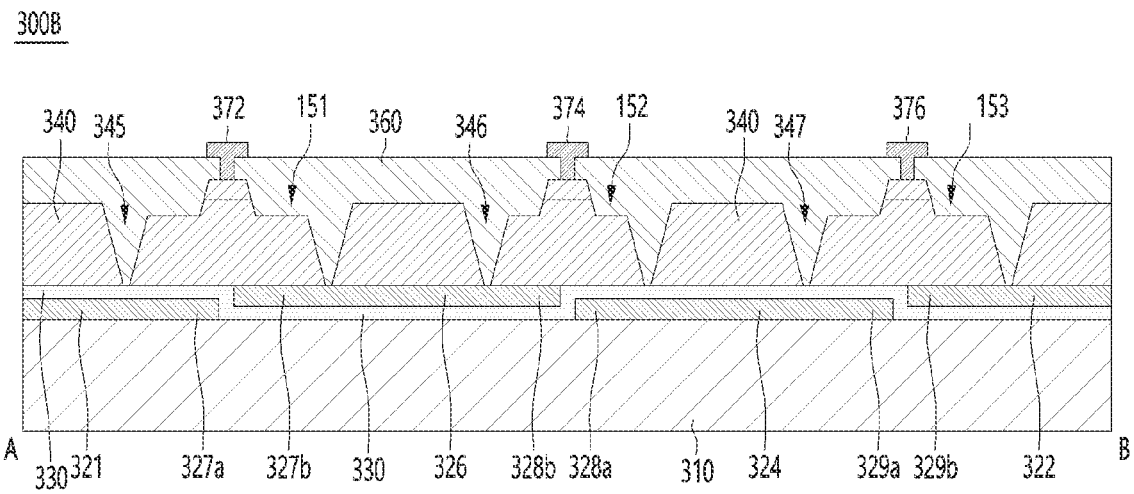
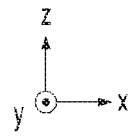
[FIG. 20]
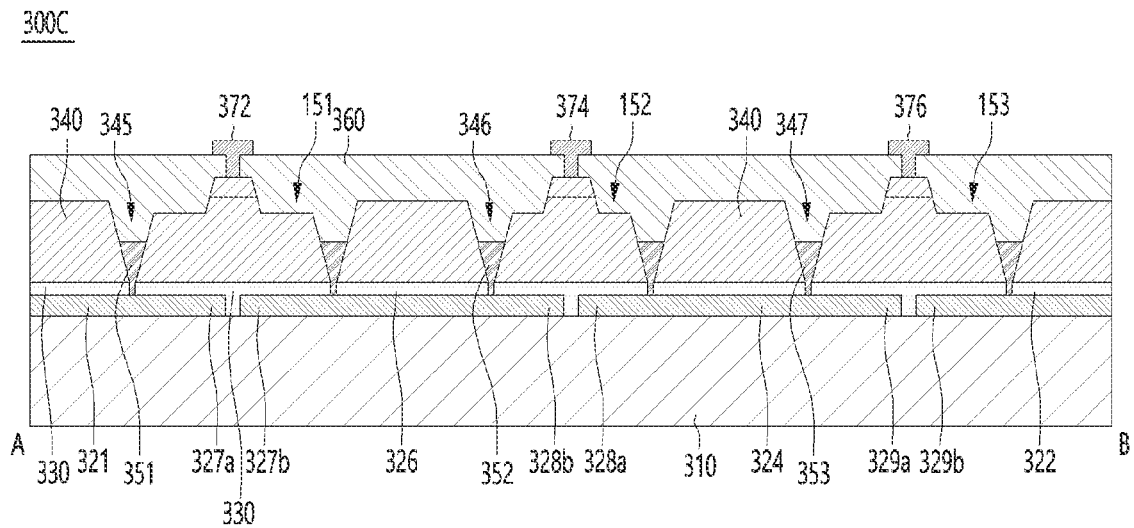
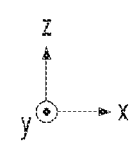

[FIG. 21]
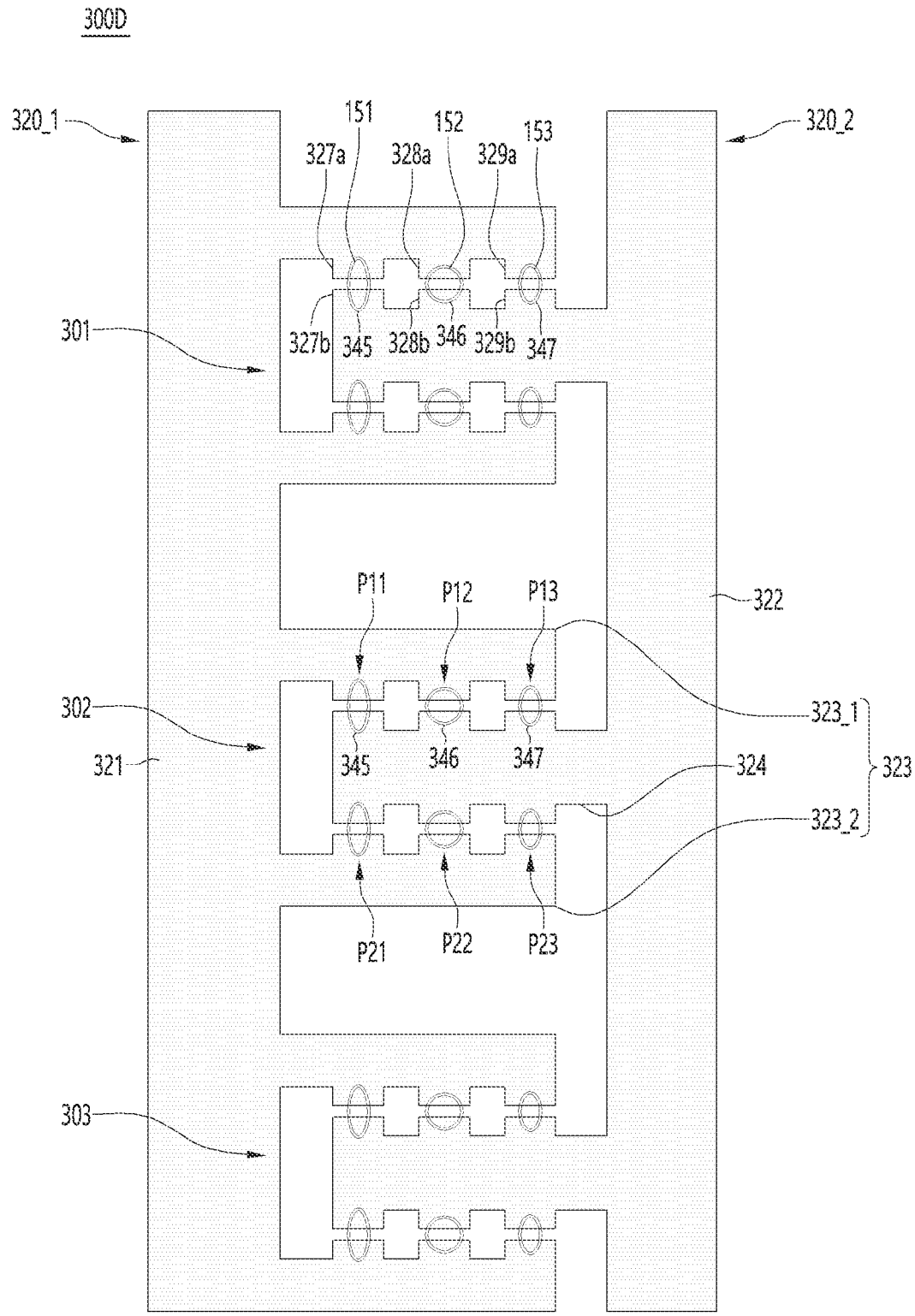

DISPLAY DEVICE

CROSS REFERENCE TO RELATED APPLICATIONS

This application is the National Phase of PCT International Application No. PCT/KR2021/013433, filed in the Republic of Korea on Sep. 30, 2021, all of which is hereby expressly incorporated by reference into the present application.

TECHNICAL FIELD

The embodiment relates to a display device.

BACKGROUND ART

Display devices display high-definition images using self-luminous devices such as light emitting diodes as light sources for pixels. Light emitting diodes exhibit excellent durability even under harsh environmental conditions and are capable of long lifespan and high brightness, so they are attracting attention as a light source for next-generation display devices.

Recently, research is underway to manufacture ultra-small light emitting diodes using highly reliable inorganic crystal structure materials and place them on panels of display devices (hereinafter referred to as "display panels") to use them as next-generation light sources.

These display devices are expanding beyond flat displays into various forms such as flexible displays, foldable displays, stretchable displays, and rollable displays.

In order to realize high resolution, the size of pixels is gradually becoming smaller, and since the light emitting device must be aligned with numerous pixels of such a small size, research on the manufacture of ultra-small light emitting diodes as small as micro or nano scale is being actively conducted.

Display devices typically contain tens of millions of pixels or more. Accordingly, because it is very difficult to align at least one light emitting element in each of tens of millions of small pixels, various studies on ways to align light emitting elements in a display panel are being actively conducted.

As the size of light emitting devices becomes smaller, quickly and accurately transferring these light emitting devices onto the substrate is becoming a very important problem to solve. Transfer technologies that have been recently developed include the pick and place process, laser lift-off method, or self-assembly method. In particular, the self-assembly method of transferring a light emitting device onto a substrate using a magnetic material (or magnet) has recently been in the spotlight.

In the self-assembly method, numerous light emitting devices are dropped into the mold containing the fluid, and as the magnetic material moves, the light emitting devices dropped into the fluid are moved to the pixels of the substrate, and the light emitting devices are aligned to each pixel. Therefore, the self-assembly method is attracting attention as a next-generation transfer method because it may quickly and accurately transfer numerous light emitting devices onto the substrate.

FIG. 1 shows a display device including a plurality of assembly wiring for assembling a light emitting device.

As shown in FIG. 1, the display device includes a plurality of assembly wiring 1a, 1b, 2a, 2b, 3a and 3b arranged along one direction.

For example, a first pair of assembly wirings $1_a$ and 1b, a second pair of assembly wirings 2a and 2b, and a third pair of assembly wirings 3a and 3b are provided. For example, as shown in FIG. 2, a red semiconductor light emitting device 7, a green semiconductor light emitting device 8, and a blue semiconductor light emitting device 9 are assembled in the unit pixel PX. That is, the red semiconductor light emitting device 7 is assembled in the assembly hole 4 on the first pair of assembly wiring $1_a$ and 1b. The green semiconductor light emitting device 8 is assembled into the assembly hole 5 on the second pair of assembly wirings 2a and 2b by the voltage of the second pair of assembly wirings 2a and 2b. The blue semiconductor light emitting device 9 is assembled into the assembly hole 6 on the third pair of assembly wirings 3a and 3b by the voltage of the third pair of assembly wirings 3a and 3b.

As the screen size of the display device increases, the length of each of the plurality of assembly wirings 1a, 1b, 2a, 2b, 3a and 3b increases. As the length of each of the plurality of assembly wirings 1a, 1b, 2a, 2b, 3a and 3b increases, voltage distortion occurs due to the line resistance of each of the plurality of assembly wirings 1a, 1b, 2a, 2b, 3a and 3b.

For example, when voltage is applied from an upper side of a plurality of assembly wirings 1a, 1b, 2a, 2b, 3a and 3b to a plurality of assembly wirings 1a, 1b, 2a, 2b, 3a and 3b, as the voltage goes from the upper to a lower side of the plurality of assembly wirings 1a, 1b, 2a, 2b, 3a and 3b, the voltage at the lower side becomes smaller than the voltage at the upper side due to distortion due to line resistance. In this case, if the voltage applied from the upper side of the plurality of assembly wirings 1a, 1b, 2a, 2b, 3a and 3b is the voltage for the light emitting device to be stably assembled in the assembly hole 4, 5 and 6, the voltage on the lower side of the plurality of assembly wiring 1a, 1b, 2a, 2b, 3a and 3b is smaller than the voltage on the upper layer. Since the strength of the dielectrophoretic force is determined by the voltage, as the voltage decreases, the strength of the dielectrophoretic force decreases. Therefore, there is a problem that the assembly rate is reduced because the light emitting elements are not assembled in the assembly holes 4, 5 and 6 on the lower side of the plurality of assembly wirings 1a, 1b, 2a, 2b, 3a and 3b.

Meanwhile, as shown in FIGS. 1 and 2, in order to assemble the red semiconductor light emitting device 7, the green semiconductor light emitting device 8, and the blue semiconductor light emitting device in the unit pixel PX, six assembly wirings 1a, 1b, 2a, 2b, 3a and 3b are required. Since numerous unit pixels PX are defined from left to right of the display device, assembly wiring 1a, 1b, 2a, 2b, 3a and 3b that is six times the number of unit pixels PX defined along the horizontal direction of the display device is required. Therefore, voltage must be applied individually to numerous assembly wirings 1a, 1b, 2a, 2b, 3a and 3b, which causes the circuit to become complicated.

In addition, as high resolution or ultra-high resolution increases, the line width of each assembly wiring 1a, 1b, 2a, 2b, 3a and 3b becomes smaller and the process margin decreases, making it increasingly difficult to form assembly wiring 1a, 1b, 2a, 2b, 3a and 3b. Electrical short circuits may occur due to connections between assembly wirings 1a, 1b, 2a, 2b, 3a and 3b.

DISCLOSURE

Technical Problem

The embodiment aims to solve the above-mentioned problems and other problems.

Another object of the embodiment is to provide a display device that can improve assembly rate by minimizing voltage drop.

Another object of the embodiment is to provide a display device that facilitates the formation of assembly wiring at high resolution or ultra-high resolution.

Another object of the embodiment is to provide a display device that can simplify a circuit for driving electrode wiring.

The technical problems of the embodiments are not limited to those described in this item and include those that can be understood through the description of the invention.

Technical Solution

According to one aspect of the embodiment to achieve the above or other purposes, the display device comprises a substrate including a plurality of pixels—each of the plurality of pixels including a first to third sub-pixels-; a first assembly wiring on the substrate; a second assembly wiring on the substrate; a partition having a first to third assembly holes in the first to third sub-pixels of each of the plurality of pixels; and a first to third semiconductor light emitting device; the first assembly wiring includes a first bus wiring; and a plurality of first branch wiring branched from the first bus wiring, the second assembly wiring includes a second bus wiring; and a plurality of second branch wiring branched from the second bus wiring, each of the first to third semiconductor light emitting devices may be disposed in the first to third assembly holes between the first bus wiring, the second bus wiring, the first branch wiring, and the second branch wiring.

The first assembly wiring includes a plurality of first assembly electrodes branched from each of the plurality of first branch wirings, the second assembly wiring includes a plurality of second assembly electrodes branched from each of the plurality of second branch wirings and facing the plurality of first assembly electrodes, each of the first to third semiconductor light emitting devices may be disposed in the first to third assembly holes on the first assembly electrode and the second assembly electrode.

The first assembly electrode branches off from the first bus wiring, and one of the first to third semiconductor light emitting devices may be disposed on a first assembly wiring branched from the first bus wiring and a second assembly electrode branched from the second branch wiring.

The second assembly electrode branches off from the second bus wiring, and another semiconductor light emitting device among the first to third semiconductor light emitting devices may be disposed on a first assembly electrode branched from the first branch wiring and a second assembly electrode branched from the second bus wiring.

A width of the first bus wiring may be greater than a width of the first assembly electrode, and a width of the second bus wiring may be greater than a width of the second assembly electrode.

The first branch wiring may include a first-first branch wiring branched from the first bus wiring; and a plurality of first-second branch wirings branching from the first-first branch wiring The plurality of pixels include a first pixel and a second pixel that are adjacent to each other, one first-second branch wiring of the plurality of first-second branch wirings may be disposed in the first pixel, and another first-second branch wiring among the plurality of first-second branch wirings may be disposed in the second pixel.

The second branch wiring may include a second-first branch wiring branched from the second bus wiring; and a plurality of second-second branch wirings branching from the second-first branch wiring.

The plurality of pixels include a third pixel adjacent to the second pixel, one second-second branch wiring of the plurality of second-second branch wirings may be disposed in the second pixel, and another second-second branch wiring among the plurality of second-second branch wirings may be disposed in the third pixel.

Advantageous Effects

In the embodiment, as shown in FIGS. 9, 10, and 16, line resistance can be minimized by setting the widths W1 and W2 of each of the first bus wiring 321 and the second bus wiring 322 across the entire area of the substrate 310 to the maximum width. Accordingly, the voltage drop due to the line resistance of each of the first bus wiring 321 and the second bus wiring 322 is prevented, a desired dielectrophoretic force is formed in each assembly hole 345, 346, and 347 of the entire area of the substrate 310, so that the assembly rate can be improved.

In the embodiment, as shown in FIGS. 9, 10, and 16, by being arranged by two assembly wirings 320_1 and 3202 per pixel 301, 302 and 303, the first to third semiconductor light emitting devices 151, 152 and 153 can be assembled using the two assembly wirings 320_1 and 320_2. In other words, while six assembly wirings per pixel are required in the past, the embodiment can reduce the number of assembly wirings by ⅓, enabling stable layout of assembly wiring without causing electrical shorts even in high-resolution or ultra-high-resolution displays.

As shown in FIGS. 9, 10, and 16, the embodiment can dramatically reduce the number of assembly wirings 321 and 322 compared to the prior art, and the circuit for driving these assembly wirings 321 and 322 can be simplified.

Additional scope of applicability of the embodiments will become apparent from the detailed description below. However, since various changes and modifications within the spirit and scope of the embodiments may be clearly understood by those skilled in the art, the detailed description and specific embodiments, such as preferred embodiments, should be understood as being given by way of example only.

DESCRIPTION OF DRAWINGS

FIG. 1 shows a display device including a plurality of assembly wiring for assembling a light emitting device.

FIG. 2 shows the unit pixel of FIG. 1.

FIG. 3 shows the living room of a house where a display device according to an embodiment is placed.

FIG. 4 is a block diagram schematically showing a display device according to an embodiment.

FIG. 5 is a circuit diagram showing an example of the pixel of FIG. 4.

FIG. 6 is an enlarged view of the first panel area in the display device of FIG. 3.

FIG. 7 is an enlarged view of area A2 in FIG. 6.

FIG. 8 is a diagram showing an example in which a light emitting device according to an embodiment is assembled on a substrate by a self-assembly method.

FIG. 9 is a plan view showing a display device according to the first embodiment.

FIG. 10 is a cross-sectional view showing a display device according to the first embodiment.

FIG. 11 shows the shape of the first semiconductor light emitting device.

FIG. 12 shows the shape of the second semiconductor light emitting device.

FIG. 13 shows the shape of the third semiconductor light emitting device.

FIG. 14 is a plan view showing a second semiconductor light emitting device.

FIG. 15 is a cross-sectional view showing a second semiconductor light emitting device.

FIG. 16 shows the arrangement shape of the first assembly wiring and the second assembly wiring.

FIG. 17 shows assembly rates according to comparative examples and examples.

FIG. 18 is a cross-sectional view showing a display device according to a second embodiment.

FIG. 19 is a cross-sectional view showing a display device according to a third embodiment.

FIG. 20 is a cross-sectional view showing a display device according to the fourth embodiment.

FIG. 21 is a cross-sectional view showing a display device according to the fifth embodiment.

The size, shape, and dimensions of the components shown in the drawings may differ from the actual ones. In addition, although the same components are shown in different sizes, shapes, and numbers between the drawings, this is only an example in the drawings, and identical components may have the same size, shape, and numerical value between drawings.

MODE FOR INVENTION

Hereinafter, embodiments disclosed in the present specification will be described in detail with reference to the attached drawings, but identical or similar components will be assigned the same reference numbers regardless of the reference numerals, and duplicate descriptions thereof will be omitted. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes either directly on another element or there may be other intermediate elements in between.

Display devices described in this specification may be included TVs, shines, mobile phones, smart phones, head-up displays (HUDs) for automobiles, backlight units for laptop computers, and displays for VR or AR, etc. However, the configuration according to the embodiment described in this specification may be applied to a device capable of displaying even if it is a new product type that is developed in the future.

Hereinafter, a light emitting device and a display device including the same according to an embodiment will be described.

FIG. 3 shows a living room of a house where a display device according to an embodiment is placed.

Referring to FIG. 3, the display device 100 of the embodiment may display the status of various electronic products such as a washing machine 101, a robot vacuum cleaner 102, and an air purifier 103 and it is possible to communicate with each electronic product based on IoT and control each electronic product based on the user's setting data.

The display device 100 according to the embodiment may include a flexible display manufactured on a thin and flexible substrate. Flexible displays may bend or curl like paper while maintaining the characteristics of existing flat displays.

In a flexible display, visual information may be implemented by independently controlling the emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

FIG. 4 is a block diagram schematically showing a display device according to an embodiment, and FIG. 5 is a circuit diagram showing an example of the pixel of FIG. 4.

Referring to FIGS. 4 and 5, a display device according to an embodiment may include a display panel 10, a driving circuit 20, a scan driver 30, and a power supply circuit 50.

The display device 100 of the embodiment may drive a light emitting device in an active matrix (AM, Active Matrix) method or a passive matrix (PM, Passive Matrix) method.

The driving circuit 20 may include a data driving unit 21 and a timing control unit 22.

The display panel 10 may be rectangular, but there is no limitation thereto. That is, the display panel 10 may be formed in a circular or oval shape. At least one side of the display panel 10 may be bent to a predetermined curvature.

The display panel 10 may be divided into a display area DA and a non-display area NDA disposed around the display area DA. The display area DA is an area where pixels PX are formed to display an image. The display panel 10 may include a data lines (D1 to Dm, in is an integer greater than 2), scan lines (S1 to Sn, n is an integer of 2 or more) that intersect with the data lines (D1 to Dm), a high-potential voltage line VDDL supplied with high-potential voltage, a low-potential voltage line VSSL supplied with low-potential voltage, and a pixels PX connected to the data lines (D1 to Dm) and the scan lines (S1 to Sn).

Each of the pixels PX may include a first sub-pixel PX1, a second sub-pixel PX2, and a third sub-pixel PX3. The first sub-pixel PX1 may emit a first color light of a first main wavelength, the second sub-pixel PX2 may emit a second color light of a second main wavelength, and the third sub-pixel PX3 may emit third color light of the third main wavelength. The first color light may be red light, the second color light may be green light, and the third color light may be blue light, but are not limited thereto. Additionally, in FIG. 4, it is illustrated that each pixel PX includes three sub-pixels, but the present invention is not limited thereto. That is, each pixel PX may include four or more sub-pixels.

Each of the first sub-pixel PX1, the second sub-pixel PX2, and the third sub-pixel PX3 may be connected at least one of the data lines (D1 to Dm), at least one of the scan lines (S1 to Sn) and the high-potential voltage line VDDL. As shown in FIG. 5, the first sub-pixel PX1 may include light emitting devices LD, a plurality of transistors for supplying current to the light emitting devices LD, and at least one capacitor Cst.

Although not shown in the drawing, each of the first sub-pixel PX1, the second sub-pixel PX2, and the third sub-pixel PX3 may include only one light emitting device LD and at least one capacitor Cst.

Each of the light emitting devices LD may be a semiconductor light emitting diode including a first electrode, a plurality of conductivity type semiconductor layers, and a second electrode. Here, the first electrode may be an anode electrode and the second electrode may be a cathode electrode, but this is not limited.

The light emitting device LD may be one of a horizontal light emitting device, a flip chip type light emitting device, and a vertical light emitting device.

The plurality of transistors, as shown in FIG. 5, may include a driving transistor DT that supplies current to the light emitting devices LD, and a scan transistor ST that supplies a data voltage to the gate electrode of the driving transistor DT.

The driving transistor DT may include a gate electrode connected to the source electrode of the scan transistor ST, a source electrode connected to a high-potential voltage line VDDL to which a high-potential voltage is applied, and a drain electrode connected to the first electrodes of light emitting devices LD. The scan transistor ST may include a gate electrode connected to the scan line (Sk, k is an integer satisfying 1≤k≤n), a source electrode connected to the gate electrode of the driving transistor DT and a drain electrode connected to the data line (Dj, j is an integer satisfying 1≤j≤m).

The capacitor Cst is formed between the gate electrode and the source electrode of the driving transistor DT. The storage capacitor Cst charges the difference value between the gate voltage and source voltage of the driving transistor DT.

The driving transistor DT and the scan transistor ST may be formed of a thin film transistor. In addition, in FIG. 5, the driving transistor DT and the scan transistor ST are mainly described as being formed of a P-type MOSFET (Metal Oxide Semiconductor Field Effect Transistor), but the present invention is not limited thereto. The driving transistor DT and scan transistor ST may be formed of an N-type MOSFET. In this case, the positions of the source and drain electrodes of the driving transistor DT and the scan transistor ST may be changed.

In addition, in FIG. 5, although the first sub-pixel PX1, the second sub-pixel PX2, and the third sub-pixel PX3 each include 2T1C (2 Transistor-1 capacitor) with one driving transistor DT, one scan transistor ST and one capacitor Cst, but the present invention is not limited to this. Each of the first sub-pixel PX1, the second sub-pixel PX2, and the third sub-pixel PX3 may include a plurality of scan transistors ST and a plurality of capacitors Cst.

Since the second sub-pixel PX2 and the third sub-pixel PX3 may be represented by substantially the same circuit diagram as the first sub-pixel PX1, detailed descriptions thereof will be omitted.

The driving circuit 20 outputs signals and voltages to drive the display panel 10. For this purpose, the driving circuit 20 may include a data driving unit 21 and a timing control unit 22.

The data driving unit 21 receives digital video data DATA and source control signal DCS from the timing control unit 22. The data driving unit 21 converts digital video data DATA into analog data voltages according to the source control signal DCS and supplies them to the data lines (D1 to Dm) of the display panel 10.

The timing control unit 22 receives digital video data DATA and timing signals from the host system. Timing signals may include a vertical sync signal, a horizontal sync signal, a data enable signal, and a dot clock. The host system may be an application processor in a smartphone or tablet PC, a monitor, or a system-on-chip in a TV.

The timing control unit 22 generates control signals to control the operation timing of the data driving unit 21 and the scan driver 30. Control signals may include a source control signal DCS for controlling the operation timing of the data driving unit 21 and a scan control signal SCS for controlling the operation timing of the scan driver 30.

The driving circuit 20 may be arranged in a non-display area NDA provided on one side of the display panel 10. The driving circuit 20 may be formed of an integrated circuit (IC) and mounted on the display panel 10 using a COG (chip on glass) method, a COP (chip on plastic) method, or an ultrasonic bonding method, but the present invention is not limited to this. For example, the driving circuit 20 may be mounted on a circuit board (not shown) rather than on the display panel 10.

The data driving unit 21 is mounted on the display panel 10 using a COG (chip on glass) method, a COP (chip on plastic) method, or an ultrasonic bonding method, and the timing control unit 22 may be mounted on a circuit board.

The scan driver 30 receives a scan control signal SCS from the timing control unit 22. The scan driver 30 generates scan signals according to the scan control signal SCS and supplies them to the scan lines (S1 to Sn) of the display panel 10. The scan driver 30 may include a plurality of transistors and be formed in the non-display area NDA of the display panel 10. Alternatively, the scan driver 30 may be formed as an integrated circuit, and in this case, it may be mounted on a gate flexible film attached to another side of the display panel 10.

The circuit board may be attached to pads provided at one edge of the display panel 10 using an anisotropic conductive film. Because of this, the lead lines of the circuit board can be electrically connected to the pads. The circuit board may be a flexible printed circuit board, a printed circuit board, or a flexible film such as a chip on film. The circuit board may be bent toward the bottom of the display panel 10. Because of this, one side of the circuit board is attached to one edge of the display panel 10, and another side is placed below the display panel 10 and can be connected to a system board on which the host system is mounted.

The power supply circuit 50 may generate voltages necessary for driving the display panel 10 from the main power supplied from the system board and supply them to the display panel 10. For example, the power supply circuit 50 generates a high potential voltage VDD and a low potential voltage VSS to drive the light emitting devices LD of the display panel 10 from the main power supply, and it may be supplied to the high potential voltage line VDDL and the low potential voltage line VSSL of the display panel 10. Additionally the power supply circuit 50 may generate and supply driving voltages for driving the driving circuit 20 and the scan driver 30 from the main power supply.

FIG. 6 is an enlarged view of the first panel area in the display device of FIG. 3.

Referring to FIG. 6, the display device 100 of the embodiment may be manufactured by mechanically and electrically connecting a plurality of panel areas, such as the first panel area A1, by tiling.

The first panel area A1 may include a plurality of semiconductor light emitting devices 150 arranged for each unit pixel (PX in FIG. 4).

For example, the unit pixel PX may include a first sub-pixel PX1, a second sub-pixel PX2, and a third sub-pixel PX3. For example, a plurality of red semiconductor light emitting devices 150R may be disposed in the first sub-pixel PX1, a plurality of green semiconductor light emitting devices 150G may be disposed in the second sub-pixel PX2, and a plurality of blue semiconductor light emitting devices 150B may be disposed in the third sub-pixel PX3. The unit pixel PX may further include a fourth sub-pixel in which a semiconductor light emitting device is not disposed, but this is not limited.

FIG. 7 is an enlarged view of area A2 in FIG. 6.

Referring to FIG. 7, the display device 100 of the embodiment may include a substrate 200, an assembly wiring 201 and 202, an insulating layer 206, and a plurality of semiconductor light emitting devices 150. More components may be included than this.

The assembly wiring may include first assembly wiring 201 and second assembly wiring 202 spaced apart from each other. The first assembly wiring 201 and the second assembly wiring 202 may be provided to generate dielectrophoretic force to assemble the semiconductor light emitting device 150. For example, the semiconductor light emitting device 150 may be one of a horizontal semiconductor light emitting device, a flip chip type semiconductor light emitting device, and a vertical semiconductor light emitting device.

The semiconductor light emitting device 150 may include a red semiconductor light emitting device 150, a green semiconductor light emitting device 150G, and a blue semiconductor light emitting device 150B0 to form a unit pixel (sub-pixel), but is not limited to this, and it is also possible to implement red and green colors by using red phosphors and green phosphors, respectively.

The substrate 200 may be a support member that supports components placed on the substrate 200 or a protection member that protects the components.

The substrate 200 may be a rigid substrate or a flexible substrate. The substrate 200 may be formed of sapphire, glass, silicon, or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

The substrate 200 may be a backplane equipped with circuits in the sub-pixels PX1, PX2 and PX3 shown in FIGS. 4 and 5, such as transistors ST and DT, capacitors Cst, signal wires, etc., but there is no limitation to this.

The insulating layer 206 may include an insulating and flexible organic material such as polyimide, PAC, PEN, PET, polymer, etc., or an inorganic material such as silicon oxide (SiO2) or silicon nitride series (SiNx), and it may be integrated with the substrate 200 to form one substrate.

The insulating layer 206 may be a conductive adhesive layer that has adhesiveness and conductivity, and the conductive adhesive layer may be flexible and enable a flexible function of the display device. For example, the insulating layer 206 may be an anisotropic conductive film (ACF) or a conductive adhesive layer such as an anisotropic conductive medium or a solution containing conductive particles. The conductive adhesive layer may be a layer that is electrically conductive in a direction perpendicular to the thickness, but electrically insulating in a direction horizontal to the thickness.

The insulating layer 206 may include an assembly hole 203 into which the semiconductor light emitting device 150 is inserted. Therefore, during self-assembly, the semiconductor light emitting device 150 may be easily inserted into the assembly hole 203 of the insulating layer 206. The assembly hole 203 may be called an insertion hole, fixing hole, alignment hole, etc.

The assembly hole 203 may be different depending on the shape of the semiconductor light emitting device 150. For example, the red semiconductor light emitting device, the green semiconductor light emitting device, and the blue semiconductor light emitting device each have different shapes, and may have an assembly hole 203 having a shape corresponding to the shape of each light emitting device. For example, the assembly hole 203 may include a first assembly hole for assembling a red semiconductor light emitting device, a second assembly hole for assembling a green semiconductor light emitting device, and a third assembly hole for assembling a blue semiconductor light emitting device. For example, the red semiconductor light emitting device has a circular shape, the green semiconductor light emitting device has a first oval shape with a first minor axis and a second major axis, the blue semiconductor light emitting device may have a second oval shape with a second minor axis and a second major axis, but there is no limitation to this. The second major axis of the oval shape of the blue semiconductor light emitting device may be larger than the second major axis of the oval shape of the green semiconductor light emitting device, and the second minor axis of the oval shape of the blue semiconductor light emitting device may be smaller than the first minor axis of the oval shape of the green semiconductor light emitting device.

Meanwhile, methods of mounting the semiconductor light emitting device 150 on the substrate 200 may include, for example, a self-assembly method (FIG. 8) and a transfer method.

FIG. 8 is a diagram showing an example in which a semiconductor light emitting device according to an embodiment is assembled on a substrate by a self-assembly method.

The self-assembly method of the semiconductor light emitting device will be described with reference to FIGS. 7 and 8.

The substrate 200 may be a panel substrate of a display device. In the following description, the substrate 200 will be described as a panel substrate of a display device, but the embodiment is not limited thereto.

The substrate 200 may be formed of glass or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

Referring to FIG. 8, the semiconductor light emitting device 150 may be inserted into the chamber 1300 filled with the fluid 1200. The fluid 1200 may be water such as ultrapure water, but is not limited thereto. The chamber may be called a water tank, container, vessel, etc.

After this, the substrate 200 may be placed on the chamber 1300. Depending on the embodiment, the substrate 200 may be introduced into the chamber 1300.

As shown in FIG. 7, a pair of assembly wirings 201 and 202 corresponding to each semiconductor light emitting device 150 to be assembled may be disposed on the substrate 200.

The assembly wiring 201, 202 may be formed of a transparent electrode (ITO) or may include a metal material with excellent electrical conductivity. For example, assembly wiring 201, 202 may be formed of at least one of titanium (Ti), chromium (Cr), nickel (Ni), aluminum (Al), platinum (Pt), gold (Au), tungsten (W), or molybdenum (Mo) or an alloy thereof.

An electric field is formed in the assembly wiring 201, 202 by an externally supplied voltage, and a dielectrophoretic force may be formed between the assembly wiring 201, 202 by this electric field. The light emitting device 150 may be fixed to the assembly hole 203 on the substrate 200 by this dielectrophoretic force.

The gap between the assembly wiring 201, 202 is formed to be smaller than the width of the semiconductor light emitting device 150 and the width of the assembly hole 203, so that the assembly position of the semiconductor light emitting device 150 using an electric field may be fixed more precisely.

An insulating layer 206 is formed on the assembly wiring 201, 202 to protect the assembly wiring 201, 202 from the fluid 1200 and may prevent leakage of current flowing in the assembly wiring 201, 202. The insulating layer 206 may be formed as a single layer or multilayer of an inorganic insulator such as silica or alumina or an organic insulator.

Additionally, the insulating layer 206 may include an insulating and flexible material such as polyimide, PEN, PET, etc., and may be integrated with the substrate 200 to form one substrate.

The insulating layer 206 may be an adhesive insulating layer or a conductive adhesive layer with conductivity. The insulating layer 206 is flexible and may enable flexible functions of the display device.

The insulating layer 206 has a partition, and an assembly hole 203 may be formed by this partition. For example, when forming the substrate 200, a portion of the insulating layer 206 is removed, so that each of the semiconductor light emitting devices 150 may be assembled into the assembly hole 203 of the insulating layer 206.

The assembly hole 203 is formed in the substrate 200 to which the semiconductor light emitting devices 150 are coupled, and the surface where the assembly hole 203 is formed may be in contact with the fluid 1200. The assembly hole 203 may guide the exact assembly position of the semiconductor light emitting device 150.

Meanwhile, the assembly hole 203 may have a shape and size corresponding to the shape of the semiconductor light emitting device 150 to be assembled at the corresponding location. Accordingly, it is possible to prevent another semiconductor light emitting device from being assembled or a plurality of semiconductor light emitting devices from being assembled into the assembly hole 203.

Referring again to FIG. 8, after the substrate 200 is disposed, the assembly device 1100 including a magnetic material may move along the substrate 200. For example, a magnet or electromagnet may be used as a magnetic material. The assembly device 1100 may move while in contact with the substrate 200 in order to maximize the area to which the magnetic field is applied within the fluid 1200. Depending on the embodiment, the assembly device 1100 may include a plurality of magnetic materials or a magnetic material of a size corresponding to that of the substrate 200. In this case, the moving distance of the assembly device 1100 may be limited to within a predetermined range.

The semiconductor light emitting device 150 in the chamber 1300 may move toward the assembly device 1100 by the magnetic field generated by the assembly device 1100.

While moving toward the assembly device 1100, the semiconductor light emitting device 150 may enter the assembly hole 203 and come into contact with the substrate 200.

At this time, by the electric field applied by the assembly wiring 201, 202 formed on the substrate 200, the semiconductor light emitting device 150 in contact with the substrate 200 may be prevented from being separated by movement of the assembly device 1100.

In other words, the time required for each of the semiconductor light emitting devices 150 to be assembled on the substrate 200 may be drastically shortened by the self-assembly method using the electromagnetic field described above, so large-area, high-pixel displays may be implemented more quickly and economically.

As a predetermined solder layer (not shown) is further formed between the semiconductor light emitting device 150 assembled on the assembly hole 203 of the substrate 200 and the substrate 200, the semiconductor light emitting device 150 may improve the bonding strength.

Afterwards, electrode wiring (not shown) is connected to the semiconductor light emitting device 150 and power can be applied.

Next, although not shown, at least one insulating layer may be formed through a post-process. At least one insulating layer may be a transparent resin or a resin containing a reflective material or a scattering material.

Meanwhile, the embodiment minimizes line resistance by reducing the number of assembly wirings for assembling a plurality of semiconductor light emitting devices so that the width of each of the first bus wiring and the second bus wiring across the substrate is maximized, it is possible to improve assembly rate, simplify circuits, and design assembly wiring for high-resolution or ultra-high-resolution displays.

Descriptions omitted below can be easily understood from FIGS. 3 to 8 and the description given above in relation to the corresponding drawings.

First Example

FIG. 9 is a plan view showing a display device according to the first embodiment. FIG. 10 is a cross-sectional view showing a display device according to the first embodiment.

Referring to FIGS. 9 and 10, the display device 300 according to the first embodiment may include a substrate 310, a first assembly wiring 320_1, a second assembly wiring 320_2, a partition 340, and a first to third semiconductor light emitting devices 151, 152 and 153. The display device 300 according to the first embodiment may include a first insulating layer 330, a second insulating layer 360, a first electrode wiring 371, 373 and 375, and a second electrode wiring 372, 374 and 376. The display device 300 according to the first embodiment may include more components than these, but is not limited thereto.

Since each of the substrate 310 and the partition wall 340 is the same as the substrate 200 and the insulating layer 206 shown in FIG. 5, detailed descriptions are omitted.

The substrate 310 may include a plurality of pixels 301, 302, and 303. Each of the plurality of pixels 301, 302, and 303 may include light emitting pixels PX11, PX12, and PX13 and dummy pixels PX21, PX22, and PX23.

The light emitting pixel may include a first light emitting sub-pixel PX11, a second light emitting sub-pixel PX12, and a third light emitting sub-pixel PX13. The light emitting pixel may be a pixel in which the first to third semiconductor light emitting devices 151, 152, and 153 disposed in the first light emitting sub-pixel PX11, the second light emitting sub-pixel PX12 and the third light emitting sub-pixel PX13 emit light to display an image.

The dummy pixel may include a first dummy sub-pixel PX21, a second dummy sub-pixel PX22, and a third dummy sub-pixel PX23. When at least one of the first to third semiconductor light emitting devices 151, 152, and 153 is not disposed in the first light emitting sub-pixel PX11, the second light emitting sub-pixel PX12 and the third light emitting sub-pixel PX13 of the light emitting pixel or the first to third semiconductor light emitting devices 151, 152 and 153 disposed in the first light emitting sub-pixel PX11, the second light emitting sub-pixel PX12 and the third light emitting sub-pixel PX13 have poor light emission, the dummy pixel may emit light from the first to third semiconductor light emitting devices 151, 152 and 153 disposed in the first dummy sub-pixel PX21, the second dummy sub-pixel PX22, and the third dummy sub-pixel PX23 instead of the light emitting pixel.

For example, even if the first to third semiconductor light emitting devices 151, 152, and 153 are disposed in the first light emitting sub-pixel PX11, the second light emitting sub-pixel PX12 and the third light emitting sub-pixel PX13 of the light emitting pixel, and the first to third semiconductor devices 151, 152 and 153 are disposed in the first dummy sub-pixel PX21, the second dummy sub-pixel PX22 and the third dummy sub-pixel PX23 of the dummy pixel, the first to third semiconductor light emitting devices 151, 152, and 153 disposed in the first light emitting sub-pixel PX11, the second light emitting sub-pixel and the third light emitting sub-pixel PX13 of the light emitting pixel may be connected in a circuit to emit light preferentially.

The first assembly wiring 320_1 and the second assembly wiring 320_2 may be disposed on the substrate 310. The first assembly wiring 320_1 and the second assembly wiring 320_2 form a dielectrophoretic force to assemble the first to third semiconductor light emitting devices 151, 152 and 153 into the assembly hole 345, 346 and 347 of the partition wall 340. In addition, the first assembly wiring 320_1 and/or the second assembly wiring 320_2 may be used as electrode wiring for emitting light from the first to third semiconductor light emitting devices 151, 152, and 153.

In the drawing, the first assembly wiring 320_1 and the second assembly wiring 320_2 are shown to be spaced apart from each other on the same plane, but the first assembly wiring 320_1 and the second assembly wiring 320_2 may be arranged in different layers. For example, an insulating layer (not shown) is disposed between the first assembly wiring 320_1 and the second assembly wiring 3202, and one assembly wiring of the first assembly wiring 320_1 and the second assembly wiring 320_2 may be disposed under the insulating layer, and another assembly wiring may be disposed on the insulating layer.

Since each of the first and second assembly wirings 320_1 and 320_2 is the same as the electrode wirings 201 and 202 shown in FIG. 5, detailed descriptions are omitted.

The first insulating layer 330 may be disposed on the substrate 310. First and second assembly wirings 320_1 and 320_2 may be disposed between the first insulating layer 330 and the substrate 310. The first assembly wiring 320_1 and the second assembly wiring 320_2 may be disposed on the same layer, for example, the substrate 310. That is, the first assembly wiring 320_1 and the second assembly wiring 320_2 may be in contact with the upper surface of the substrate 310. The first assembly wiring 320_1 and the second assembly wiring 320_2 may be spaced apart from each other to prevent electrical short circuit. An alternating voltage is applied to the first assembly wiring 320_1 and the second assembly wiring 320_2, so that a dielectrophoretic force may be formed between the first assembly wiring 320_1 and the second assembly wiring 320_2. The first to third semiconductor light emitting devices 151, 152 and 153 located in the assembly holes 345, 346 and 347 may be fixed by this dielectrophoretic force. Since the first assembly wiring 320_1 and the second assembly wiring 320_2 are arranged horizontally side by side on the same layer, so that the dielectrophoretic force formed between the first assembly wiring 320_1 and the second assembly wiring 320_2 is uniform, so the first to third semiconductor light emitting devices 151, 152, and 153 may be positioned at the center of the assembly holes 345, 346, and 347.

The first insulating layer 330 may protect the first assembly wiring 320_1 and the second assembly wiring 320_2 from fluid (1200 in FIG. 6), and may prevent leakage current flowing in the first assembly wiring 320_1 and the second assembly wiring 320_2.

The first insulating layer 330 can increase dielectrophoretic force. For example, the first insulating layer 330 may be a dielectric layer. The first insulating layer 330 may be formed of a material with a high dielectric constant. The dielectrophoretic force may be proportional to the dielectric constant of the first insulating layer 330. Accordingly, the dielectrophoretic force formed between the first assembly wiring 320_1 and the second assembly wiring 320_2 is increased by the first insulating layer 330 made of a material with a high dielectric constant, by this increased dielectrophoretic force, the first to third semiconductor light emitting devices 151, 152 and 153 located in the assembly holes 345, 346 and 347 may be fixed more firmly.

For example, the first insulating layer 330 may be formed as a single layer or multilayer of an inorganic material such as silica or alumina or an organic material.

For example, the first insulating layer 330 may include an insulating and flexible material such as polyimide, PEN, PET, etc. For example, the first insulating layer 330 may be integrated with the substrate 310 to form one substrate. That is, the first assembly wiring 320_1 and the second assembly wiring 320_2 may be embedded in the substrate 310.

The first insulating layer 330 may be an adhesive insulating layer or a conductive adhesive layer with conductivity. When the first insulating layer 330 is a conductive adhesive layer, the first assembly wiring 320_1 and the second assembly wiring 320_2 are surrounded by an insulating layer to prevent an electrical short between each of the first assembly wiring 320_1 and the second assembly wiring 320_2 and the conductive adhesive layer. For example, the first insulating layer 330 is flexible and may enable a flexible function of the display device 300.

The partition 340 may be placed on the substrate 310. For example, the partition 340 may be placed on the first assembly wiring 320_1 and the second assembly wiring 3202. Partition 340 may be referred to as an insulating layer. The partition 340 may have a plurality of assembly holes 345, 346, and 347. The assembly holes 345, 346, and 347 may be provided in sub-pixels PX11. PX12, PX13, PX21, PX22, and PX23 of the pixels 301, 302, and 303, but are not limited thereto. For example, when the pixels 301, 302, and 303 include a first sub-pixel PX1*l* and PX21, a second sub-pixel PX12 and PX22, and a third sub-pixel PX13 and PX23, the first assembly hole 345 may be located in the first sub-pixel PX11 and PX21, the second assembly hole 346 may be located in the second sub-pixel PX12 and PX22 and the third assembly hole 347 may be located in the third sub-pixel PX13 and PX23.

The first to third assembly holes 345, 346 and 347 guide and secure the assembly of the first to third semiconductor light emitting devices 151, 152 and 153, during self-assembly, the first to third semiconductor light emitting devices 151, 152 and 153 moved by a magnetic material may be moved into the assembly holes 345, 346 and 347 near the assembly hole 345, 346 and 347 and fixed to the assembly holes 345, 346 and 347. For example, the first semiconductor light emitting device 151 may be fixed to the first assembly hole 345, the second semiconductor light emitting device 152 may be fixed to the second assembly hole 346, and the third semiconductor light emitting device 153 may be fixed to the third assembly hole 347.

Although the first to third assembly holes 345, 346, and 347 are shown in the drawing as having inclined inner sides, they may also have inner sides perpendicular to the upper surface of the substrate 310. The first to third semiconductor light emitting devices 151, 152, and 153 may be easily inserted into the first to third assembly holes 345, 346 and 347 by the first to third assembly holes 345, 346 and 347 having inclined inner sides.

First to third semiconductor light emitting devices 151, 152, and 153 may be disposed on the substrate 310. For example, the first to third semiconductor light emitting devices 151, 152 and 153 may be fixed to the first to third assembly holes 345, 346 and 347 by a dielectrophoretic force formed by the first assembly wiring 320_1 and the second assembly wiring 320_2.

The first to third semiconductor light emitting devices 151, 152, and 153 may be formed of a semiconductor material, such as a group IV compound or a group III-V compound. The first to third semiconductor light emitting devices 151, 152, and 153 are members that generate light according to electrical signals.

The first to third semiconductor light emitting devices 151, 152 and 153 disposed in each assembly hole 345, 346 and 347 may be one of a blue semiconductor light emitting device, a green semiconductor light emitting device, and a red semiconductor light emitting device. For example, when three assembly holes 345, 346 and 347 are placed side by side, the first semiconductor light emitting device 151 disposed in the first assembly hole 345 may be a blue semiconductor light emitting device, the semiconductor light emitting device 152 disposed in the second assembly hole 346 may be a green semiconductor light emitting device, and the semiconductor light emitting device 153 disposed in the third assembly hole 347 may be a red semiconductor light emitting device.

The semiconductor light emitting device according to the embodiment will be described in more detail with reference to FIGS. 14 and 15. FIGS. 14 and 15 show the second semiconductor light emitting device 152, but the first semiconductor light emitting device 151 and the third semiconductor light emitting device 153 may have the same structure as the second semiconductor light emitting device 152 shown in FIGS. 14 and 15. However, the first semiconductor light emitting device 151 and the third semiconductor light emitting device 153 may have a different shape from the second semiconductor light emitting device 152 shown in FIGS. 14 and 15 (See FIGS. 11 to 13).

FIG. 14 is a plan view showing a second semiconductor light emitting device. FIG. 15 is a cross-sectional view showing a second semiconductor light emitting device.

Referring to FIGS. 14 and 15, the second semiconductor light emitting device 152 according to the embodiment may include a first conductivity type semiconductor layer 1151, an active layer 1152, a second conductivity type semiconductor layer 1153, and a passivation layer 1154. Although not shown, the first electrode may be disposed on the upper surface of the first conductivity type semiconductor layer 1151, and the second electrode may be disposed on the upper surface of the second conductivity type semiconductor layer 1153. The second semiconductor light emitting device 152 according to the first embodiment may include more components. The passivation layer 1154 may be called an insulating layer, a protective layer, etc. The first conductivity type semiconductor layer 1151, the active layer 1152, and the second conductivity type semiconductor layer 1153 may be called a light emitting part.

For example, the active layer 1152 may be disposed on the first conductivity type semiconductor layer 1151, and the second conductivity type semiconductor layer 1153 may be disposed on the active layer 1152, but this is not limited.

The first conductivity type semiconductor layer 1151, the active layer 1152, and the second conductivity type semiconductor layer 1153 may be sequentially grown on a wafer (not shown) using deposition equipment such as MOCVD. Thereafter, by forming the passivation layer 1154 along the remaining area excluding a portion of the side of the first conductivity type semiconductor layer 1151, that is, another part of the side of the first conductivity type semiconductor layer 1151, the side of the active layer 1152, and the side perimeter of the second conductivity type semiconductor layer 1153, the second semiconductor light emitting device 152 may be manufactured.

The first conductivity type semiconductor layer 1151 may include a first conductivity type dopant, and the second conductivity type semiconductor layer 1153 may include a second conductivity type dopant. For example, the first conductivity type dopant may be an n-type dopant such as silicon (Si), and the second conductivity type dopant may be a p-type dopant such as boron (B).

For example, the first conductivity type semiconductor layer 1151 may be a place to generate electrons, and the second conductivity type semiconductor layer 1153 may be a place to form holes. The active layer 1152 is a place that generates light and may be called a light-emitting layer.

The first electrode 154 may be disposed on the lower portion of the light emitting parts 151, 152, and 153. The first electrode 154 may be disposed on the sides of the light emitting parts 151, 152, and 153. The second electrode 155 may be disposed on top of the light emitting parts 151, 152, and 153. The first electrode 154 and the second electrode 155 supply current to the light emitting parts 151, 152, and 153, so that the light emitting parts 151, 152, and 153 may emit light with a luminance corresponding to the current.

The first electrode 154 and the second electrode 155 may be made of metal with excellent electrical conductivity. The first electrode 154 and the second electrode 155 may be made of at least one or more layers. The first electrode 154 and the second electrode 155 may be made of different metals, but are not limited thereto.

For example, at least one of the first electrode 154 and the second electrode 155 may include a magnetic layer. For example, as shown in FIG. 6, when magnetized by the magnetic material of the assembly device 1100, the second semiconductor light emitting device 152 including a magnetic layer may be moved toward the magnetic material due to an attractive force acting on the magnetic material of the assembly device 1100. Accordingly, the second semiconductor light emitting device 152 may be moved along the movement direction of the magnetic material of the assembly device 1100. In this way, the moving second semiconductor light emitting device 152 may be pulled by the dielectrophoretic force formed in the assembly hole 346 on the substrate 310 and assembled in the assembly hole 346.

Meanwhile, the first electrode 154 may include a reflective layer. In this case, light generated in the active layer 1152 is reflected, thereby improving light extraction efficiency and improving luminance.

The passivation layer 1154 may be disposed on the sides of the light emitting parts 151, 152, and 153. The passivation layer 1154 may be disposed on top of the light emitting parts

151, 152, and 153. For example, the passivation layer 1154 may be disposed on the second electrode 155 of the light emitting parts 151, 152, and 153.

For example, the passivation layer 1154 may protect the light emitting parts 151, 152, and 153.

For example, the passivation layer 1154 may block leakage current of the light emitting parts 151, 152, and 153. Leakage current may flow through the sides of the light emitting parts 151, 152, and 153, that is, the side of the first conductivity type semiconductor layer 1151, the side of the active layer 1152, and the side of the second conductivity type semiconductor layer 1153. By forming the passivation layer 1154 on the side of the first conductivity type semiconductor layer 1151, the side of the active layer 1152, and the side of the second conductivity type semiconductor layer 1153, leakage current may be prevented.

For example, the passivation layer 1154 may assist in the assembly of the second semiconductor light emitting device 152. That is, by adjusting the placement area of the first electrode 154 and the passivation layer 1154 disposed on the outer side of the second semiconductor light emitting device 152, the second semiconductor light emitting device 152 may be pulled into the assembly hole 346 by the dielectrophoretic force formed between the first assembly wiring 320_1 and the second assembly wiring 320_2. For example, the first electrode 154 of the second semiconductor light emitting device 152 is disposed close to the first assembly wiring 320_1 and the second assembly wiring 320_2, by disposing the passivation layer 1154 away from the first assembly wiring 320_1 and the second assembly wiring 320_2, the second semiconductor light emitting device 152 may be pulled into the assembly hole 346 by dielectrophoretic force. Accordingly, the second semiconductor light emitting device 152 may be pulled into the assembly hole 346 by the dielectrophoretic force and then continuously fixed within the assembly hole 346. Afterwards, even if dielectrophoretic force is not generated, the second semiconductor light emitting device 152 may be fixed within the assembly hole 345 by natural forces such as surface tension or van der Waals force.

For example, a second opening 1202 without a passivation layer 1154 may be formed in a portion of the second electrode 155 of the light emitting parts 151, 152, and 153. As will be explained later, the electrode wiring 372 may be electrically connected to the second electrode 155 of the second semiconductor light emitting device 152 through the second opening 1202.

Meanwhile, the passivation layer 1154 may be formed on a portion of the side of the light emitting parts 151, 152, and 153. That is, the passivation layer 1154 is disposed in one area on the side of the light emitting parts 151, 152, and 153, and the first electrode 154 may be disposed in another area on the side of the light emitting parts 151, 152, and 153.

The first electrode 154 is formed on the side of the light emitting parts 151, 152, and 153 in order to easily electrically connect it to the connection electrode 350. As the first electrode 154 is formed to have a larger area on the sides of the light emitting parts 151, 152, and 153, the contact area between the connection electrode 350 and the first electrode 154 can be larger. In this case, current flows more smoothly through the light emitting parts 151, 152, and 153 to output more light, which means that luminance is improved.

Meanwhile, the first to third semiconductor light emitting devices 151, 152, and 153 may be horizontal semiconductor light emitting devices. In this case, the first electrode and the second electrode (not shown) of each of the first to third semiconductor light emitting devices 151, 152, and 153 may be positioned toward the same direction. As shown in FIG. 10, the first electrode and the second electrode of the semiconductor light emitting device may be arranged to face upward.

As shown in FIGS. 14 and 15, a first opening 1201 is formed to expose the first electrode (not shown) disposed on the upper surface of the first conductivity type semiconductor layer 1151, the second opening 1202 may be formed to expose the second electrode (not shown) disposed on the upper surface of the second conductivity type semiconductor layer 1153. As shown in FIG. 10, the first electrode wiring 373 may be electrically connected to the first electrode of the second semiconductor light emitting device 152 through the first opening 1201, and the second electrode wiring 374 may be electrically connected to the second electrode of the second semiconductor light emitting device 152 through the second opening 1202.

Referring again to FIG. 10, the second insulating layer 360 may be disposed on the substrate 310. For example, the second insulating layer 360 may be disposed on the partition 340 and the first to third semiconductor light emitting devices 151, 152, and 153. The second insulating layer 360 may be disposed in the assembly holes 345, 346, and 347. The second insulating layer 360 may be formed of an organic material or an inorganic material.

For example, a portion of the second insulating layer 360 may be removed to form a contact hole exposing the first and second electrodes of each of the first to third semiconductor light emitting devices 151, 152, and 153. Through this contact hole, a first electrode wiring 371, 373 and 375 and a second electrode wiring 372, 374 and 376 may be electrically connected to the first and second electrodes of each of the first to third semiconductor light emitting devices 151, 152, and 153. The first to third semiconductor light emitting devices 151, 152, and 153 may emit light by voltage applied to the first electrode wiring and the second electrode wiring. Light having luminance corresponding to the current flowing through the first to third semiconductor light emitting devices may be generated in the active layer 1152 of each of the first to third semiconductor light emitting devices 151, 152, and 153 by the voltage applied to the first electrode wiring and the second electrode wiring. The voltage applied to each of the first to third semiconductor light emitting devices 151, 152, and 153 is different, and the luminance of light generated from each of the first to third semiconductor light emitting devices 151, 152, and 153 may be different due to the different voltages.

One of the first electrode wiring and the second electrode wiring connected to the first to third semiconductor light emitting devices 151, 152, and 153 may be a common wiring connected in common. For example, a first electrode wiring 371 connected to the first semiconductor light emitting device 151, a second electrode wiring 373 connected to the second semiconductor light emitting device 152, and a third electrode wiring 375 connected to the third semiconductor light emitting device 153 may be a common wiring connected to each other. For example, a first electrode wiring 371 connected to the first semiconductor light emitting device 151, a second electrode wiring 373 connected to the second semiconductor light emitting device 152, and a third electrode wiring 375 connected to the third semiconductor light emitting device 153 may be grounded, but this is not limited.

In the display device 300 according to the first embodiment, after the first to third semiconductor light emitting devices 151, 152 and 153 are assembled in the first to third assembly holes 345, 346 and 347 of the partition 340 by using the voltage applied to the first assembly wiring 320_1 and the second assembly wiring 3202, the first electrode wiring and the second electrode wiring may be electrically connected to the first to third semiconductor light emitting devices 151, 152, and 153, respectively by post-process.

Meanwhile, in the embodiment, the first to third semiconductor light emitting devices 151, 152, and 153 may have different shapes. For example, the second semiconductor light emitting device 152 may have a circular shape (FIG. 12), and the first semiconductor light emitting device 151 and the third semiconductor light emitting device 153 may have a shape other than a circular shape. For example, as shown in FIGS. 11 and 13, the first semiconductor light emitting device 151 and the third semiconductor light emitting device 153 may have an oval shape. For example, the first semiconductor light emitting device 151 may have an oval shape with a first major axis X11 and a first minor axis Y11. For example, the third semiconductor light emitting device 153 may have an oval shape with a second major axis X12 and a second minor axis Y12. For example, the first major axis X11 of the first semiconductor light emitting device 151 may be larger than the second major axis X12 of the third semiconductor light emitting device 153. For example, the first minor axis Y11 of the first semiconductor light emitting device 151 may be smaller than the second minor axis Y12 of the third semiconductor light emitting device 153, but this is not limited. For example, the diameter D of the second semiconductor light emitting device 152 may be larger than the first minor axis Y11 of the first semiconductor light emitting device 151 and/or the second minor axis Y12 of the third semiconductor light emitting device 153, but there is not limited thereto.

The shapes of the first to third assembly holes 345, 346, and 347 may correspond to the shapes of the first to third semiconductor light emitting devices 151, 152, and 153. For example, the first assembly hole 345 may have a shape corresponding to the shape of the first semiconductor light emitting device 151. For example, the second assembly hole 346 may have a shape corresponding to the shape of the second semiconductor light emitting device 152. For example, the third assembly hole 347 may have a shape corresponding to the shape of the third semiconductor light emitting device 153. To make assembly easier, the size of the shape of the first to third assembly holes 345, 346 and 347 may be larger than the size of the shape of the first to third semiconductor light emitting device 151, 152 and 153.

In summary, the first to third semiconductor light emitting devices 151, 152, and 153 have different shapes, and the first to third assembly holes 345, 346, and 347 may have different shapes and may have shapes corresponding to the shapes of the first to third semiconductor light emitting devices 151, 152, and 153.

Accordingly, each of the first to third semiconductor light emitting devices 151, 152 and 153 is assembled in the first to third assembly holes 345, 346 and 347 having the same shape as its own shape and is not assembled in the first to third assembly holes 345, 346, and 347 having different shapes, the assembly rate can be significantly improved.

Meanwhile, as shown in FIG. 1, in order to assemble a plurality of semiconductor light emitting devices over the entire area of a large-area substrate in a display device with a large-area screen, the first assembly wiring 1a, 2a and 3a and the second assembly wiring 1b, 2b and 3b must be placed in the entire area of the large-area substrate. For example, first assembly wiring 1a, 2a and 3a and second assembly wiring 1b, 2b and 3b are arranged across the center of the substrate between the upper and lower sides of the substrate. To assemble one semiconductor light emitting device, one set of assembly wiring is required, for example, three pairs, that is, a first pair of assembly wiring 1a and 1b, a second pair of assembly wiring 2a and 2b, and a third pair of assembly wiring 3a and 3b is required to assemble a red semiconductor light emitting device, a green semiconductor light emitting device, and a blue semiconductor light emitting device placed in each sub-pixel of the pixel. That is, six assembly wiring 1a, 1b, 2a, 2b, 3a, 3b is required to assemble a red semiconductor light emitting device, a green semiconductor light emitting device, and a blue semiconductor light emitting device disposed in each sub-pixel of the pixels 301, 302, and 303. Likewise, since six assembly wirings 1a, 1b, 2a, 2b, 3a and 3b are arranged in a pixel like this, a width of each assembly wiring 1a, 1b, 2a, 2b, 3a and 3b is narrow. The narrower the width of each assembly wiring 1a, 1b, 2a, 2b, 3a and 3b, the greater the line resistance.

Therefore, when voltage is applied to the first assembly wiring 1a, 2a and 3a and the second assembly wiring 1b, 2b and 3b from one side of the substrate, for example, the upper side, a voltage drop occurs due to the line resistance of each of the first assembly wiring 1a, 2a and 3a and the second assembly wiring 1b. 2b and 3b, so that the voltage on the lower side of the substrate becomes smaller than the voltage on the upper side of the substrate. Therefore, there is a problem that the assembly rate of the semiconductor light emitting device is reduced because the desired dielectrophoretic force is not formed on the lower side or part of the substrate.

In addition, 6 assembly wirings 1a, 1b, 2a, 2b, 3a and 3b are arranged per pixel, and the voltage supply to numerous assembly wirings placed on the board must be controlled, causing the problem of circuit complexity.

In addition, as high resolution or ultra-high resolution increases, the line width of each assembly wiring 1a, 1b, 2a, 2b, 3a, and 3b becomes smaller, and the process margin also decreases, making it increasingly difficult to form assembly wiring 1a, 1b, 2a, 2b, 3a, and 3b. An electrical short may occur when connected between assembly wirings 1a, 1b, 2a, 2b, 3a and 3b.

As shown in FIG. 9, the embodiment minimizes line resistance by increasing the line width of the first bus wiring 321 and the second bus wiring 322 disposed across the center of the substrate 310. Accordingly, the first to third semiconductor light emitting devices 151, 152, and 153 can be smoothly and stably assembled in all areas of the substrate 310, thereby improving the assembly rate.

The embodiment requires only two wires per pixel 301, 302 and 303, that is, the first bus wiring 321 and the second bus wiring 322, so it is easy to control the voltage supply of these wirings 321 and 322, and the circuit can also be simplified by reducing the number of wires by ⅓ compared to the prior art (FIG. 1).

In the embodiment, only two wirings, that is, the first bus wiring 321 and the second bus wiring 322, are required per pixel 301, 302 and 303, so the spacing between branch wiring 323, 324, 325 and 326 may be designed to be wide. Accordingly, even if a high-resolution or ultra-high-resolution display device 300 is implemented, electrical shorts between wires do not occur, thereby preventing wiring-related defects.

Meanwhile, with reference to FIG. 9, the first assembly wiring 320_1 and the second assembly wiring 320_2 will be described in more detail. The first assembly wiring 320_1 and/or the second assembly wiring 320_2 may include at least one or more layers.

The first assembly wiring 320_1 may include a first bus wiring 321 and a plurality of first branch wiring 323 and 324. The first bus wiring 321 may be disposed in a plurality of pixels 301, 302, and 303. For example, the first bus wiring 321 may be arranged long along the second direction (y). For example, the first bus wiring 321 may be arranged from the top to the bottom or from the bottom to the top across the center of the substrate 310 along the second direction (y). A plurality of first branch wirings 323 and 324 may branch from the first bus wiring 321. For example, each of the plurality of first branch wirings 323 and 324 may branch from a plurality of sides of the first bus wiring 321 and be disposed along the first direction (x). For example, the first bus wiring 321 and the plurality of first branch wirings 323 and 324 may be formed integrally with the same metal, but this is not limited.

The second assembly wiring 320_2 may include a second bus wiring 322 and a plurality of second branch wiring 325 and 326. The second bus wiring 322 may be disposed in a plurality of pixels 301, 302, and 303. For example, the second bus wiring 322 may be arranged long along the second direction (y). For example, the second bus wiring 322 may be arranged from the top to the bottom or from the bottom to the top across the center of the substrate 310 along the second direction (y). For example, the second bus wiring 322 may be arranged in parallel with the first bus wiring 321. For example, the second bus wiring 322 may be arranged along the second direction (y) while maintaining equal intervals from the first bus wiring 321. A plurality of second branch wirings 325 and 326 may branch from the second bus wiring 322. For example, each of the plurality of second branch wirings 325 and 326 may branch from a plurality of sides of the second bus wiring 322 and be disposed along the first direction (–x). For example, each of the plurality of second branch wirings 325 and 326 may be arranged along a first direction (–x) from a plurality of sides of the second bus wiring 322 toward the first bus wiring 321. For example, the second branch wiring 325 and 326 may be arranged in parallel with the first branch wiring 323 and 324. The first branch wiring 323 and 324 and the second branch wiring 325 and 326 may be formed integrally with the same metal, but this is not limited. For example, the first bus wiring 321, the plurality of first branch wirings 323 and 324, the second bus wiring 322 and the plurality of second branch wirings 325 and 326 may be integrally formed of the same metal, but there is no limitation to this.

Each of the first to third semiconductor light emitting devices 151, 152, and 153 may be disposed in the first to third assembly holes 345, 346 and 347 between the first branch wiring 323 and 324 and the second branch wiring 325 and 326. The first to third assembly holes 345, 346, and 347 may be positioned in a row along the first direction (x).

The first branch wiring may include a first-first branch wiring 323 branching from the first bus wiring 321 and a plurality of first-second branch wiring 324 branching from the first-first branch wiring 323. For example, the width of the first-second branch wiring 324 may be smaller than the width of the first-first branch wiring 323, but this is not limited.

For example, one first-second branch wiring 324_1 of the plurality of first-second branch wirings 324 is disposed in the first pixel 301, and another first-second branch wiring 324_2 among the plurality of first-second branch wirings 324 may be disposed in the second pixel 302.

For example, the first-first branch wiring 323 extends from one side of the first bus wiring 321 located between the first pixel 301 and the second pixel 302, and may be placed between the first pixel 301 and the second pixel 302. In this case, one first-second branch wiring 324_1 and another first-second branch wiring 324_2 may be arranged symmetrically with respect to the first-first branch wiring 323, but this is not limited. One first-second branch wiring 324_1 may extend along the (+)y direction from the end of the first-first branch wiring 323 and be disposed in the first pixel 301. Another first-second branch wiring 324_2 may extend along the (–)y direction from the end of the first-first branch wiring 323 and be disposed in the second pixel 302.

The second branch wiring may include a second-first branch wiring 325 branched from the second bus wiring 322 and a plurality of second-second branch wirings 326 branched from the second-first branch wiring 325. For example, the width of the second-second branch wiring 326 may be smaller than the width of the second-first branch wiring 325, but this is not limited.

For example, one second-second branch wiring 326_1 of the plurality of second-second branch wirings 326 is disposed in the second pixel 302, and another second-second branch wiring 326_2 among the plurality of second-second branch wirings 326 may be disposed in the third pixel 303.

For example, the second-first branch wiring 325 extends from one side of the second bus wiring 322 located between the second pixel 302 and the third pixel 303, and may be placed between the second pixel 302 and the third pixel 303. In this case, one second-second branch wiring 326_1 and another second-second branch wiring 326_2 may be arranged symmetrically with respect to the second-first branch wiring 325, but this is not limited. One second-second branch wiring 326_1 may extend along the (+)y direction from the end of the second-first branch wiring 325 and be disposed in the second pixel 302. Another second-second branch wiring 326_2 may extend along the (–)y direction from the end of the second-first branch wiring 325 and be disposed in the third pixel 303.

For example, the first-first branch wiring 323 and the second-first branch wiring 325 may be arranged alternately or staggered along the second direction (y). For example, a first-first branch wiring 323 is disposed between the first pixel 301 and the second pixel 302 along the second direction, and second-first branch wiring 325 may be disposed between the second pixel 302 and the third pixel 303. Subsequently, the first-first branch wiring 323 may be placed between the third pixel 303 and the fourth pixel, and the second-first branch wiring 325 may be placed between the fourth pixel and the fifth pixel.

For example, the first bus wiring 321 and the second bus wiring 322 may be arranged side by side along the second direction (y) in the plurality of pixels 301, 302, and 303. For example, a portion of the first branch wiring 323 and 324 between the first bus wiring 321 and the second bus wiring 322 in the plurality of pixels 301, 302 and 303, that is, part of the first-second branch wiring 324_1 and 324_2 and the second branch wiring 325 and 326, that is, the second-second branch wiring 326_1 and 326_2 may be placed. For example, The second-second branch wiring 326_1 and 326_2 may be placed adjacent to the first bus wiring 321, and the first-second branch wiring 324_1 and 324_2 may be placed adjacent to the second bus wiring 322. For example, the first-second branch wiring 324_1 and 324_2 and the second-second branch wiring 326_1 and 326_2 may be placed adjacent to each other. For example, along the first direction (x), the first bus wiring 321, the second-second branch wiring 326_1 and 3262, the first-second branch wiring 324_1 and 324_2, and the second bus wiring 322 may be placed.

Meanwhile, the first assembly wiring 320_1 may include a plurality of first assembly electrodes 327a, 328a and 329a and a plurality of second assembly electrodes 327b, 328b and 329b. For example, the first assembly electrode may include a first-first assembly electrode 327a, a first-second assembly electrode 328a, and a first-third assembly electrode 329a. For example, the second assembly electrode may include a second-first assembly electrode 327b, a second-second assembly electrode 328b, and a second-third assembly electrode 329b.

The plurality of first assembly electrodes 327a, 328a and 329a may be branched from the first bus wiring 321 and/or the first branch wiring 323 and 324. For example, the first assembly electrode 327a may be branched from the first bus wiring 321. For example, the first assembly electrode 328a and 329a may be branched from a part of the first branch wiring 323 and 324, that is, the first-second branch wiring 324_1 and 324_2.

The plurality of second assembly electrodes 327b, 328b and 329b may be branched from the second bus wiring 322 and/or second branch wiring 325 and 326. For example, the second assembly electrode 329b may be branched from the second bus wiring 322. For example, the second assembly electrode 327b and 328b may be branched from a portion of the second branch wiring 325 and 326, that is, the second-second branch wiring 326_1 and 326_2.

In this case, the first to third semiconductor light emitting devices 151, 152 and 153 may be connected to the first to third assembly holes 345, 346 and 347 on the first assembly electrode 327a, 328a and 329a and the second assembly electrode 327b, 328b and 329b. For example, the first semiconductor light emitting device 151 may be disposed to a first assembly hole 345 on the first-first assembly electrode 327a branched from the first bus wiring 321 and the second-first assembly electrode 327b branched from the second-second branch wiring 326_1 and 326_2. For example, the second semiconductor light emitting device 152 may be disposed to a second assembly hole 346 on the first-second assembly electrode 328a branched from the first-second branch wiring 3241, 324_2 and the second-second assembly electrode 328b branched from the second-second branch wiring 3261, 326_2. For example, the third semiconductor light emitting device 153 may be disposed to a third assembly hole 347 on the first-third assembly electrode 329a branched from the first-second branch wiring 324_1 and 324_2 and the second-3 assembly electrode 329b branched from the second bus wiring 322.

Meanwhile, as shown in FIG. 16, a width w1 of the first bus wiring 321 may be larger than a width w3 of the first branch wiring 323 or a width w4 of the second branch wiring 325. In addition, a width w2 of the second bus wiring 322 may be larger than a width w3 of the first branch wiring 323 or a width w4 of the second branch wiring 325. The width of the first bus wiring 321 and the width of the second bus wiring 322 may be the same, but this is not limited. The width of the first branch wiring 323 and 324 and the width of the second branch wiring 325 and 326 may be the same, but this is not limited.

For example, the width of the first bus wiring 321 may be greater than a width w7 of the first assembly electrodes 327a, 328a, and 329a or the width w8 of the second assembly electrodes 327b. 328b, and 329b. The width of the second bus wiring 322 may be greater than the width w7 of the first assembly electrodes 327a, 328a, and 329a or a width w8 of the second assembly electrodes 327b, 328b, and 329b.

In this way, by making the widths w1 and w2 of the first bus wiring 321 and/or the second bus wiring 322 large, since the line resistance of each of the first bus wiring 321 and the second bus wiring 322 is minimized, voltage enhancement is suppressed, so the assembly rate can be improved by preventing assembly defects of the first to third semiconductor light emitting devices 151, 152, and 153 on the entire area of the substrate 310.

For example, a distance d3 between the first-first branch wiring 323 and the second-second branch wiring 326 may be larger than the width w3 and w5 of the first branch wiring 323 and 324 or the width w4 and w6 of the second branch wiring 325 and 326. By increasing the distance d3 between the first-first branch wiring 323 and the second-second branch wiring 326, assembly defects can be minimized by ensuring that the first to third semiconductor light emitting devices 151, 152, and 153 are not properly assembled in areas other than the first to third assembly holes 345, 346, and 347.

For example, the width w5 of the first-second branch wiring 324 is equal to or smaller than the width w3 of the first-first branch wiring 323, and the width w6 of the second-second branch wiring 326 may be equal to or smaller than the width w4 of the second-first branch wiring 325, but is not limited thereto.

For example, the distance d1 between the first bus wiring 321 and the second-first branch wiring 325 may be greater than the major axis X11 of the first semiconductor light emitting device 151. In other words, the distance d1 between the first bus wiring 321 and the second-first branch wiring 325 may be larger than the largest major axis X11 among the major axis X11 and X12 of the first to third semiconductor light emitting devices 151, 152 and 153. For example, the distance d2 between the second bus wiring 322 and the first-first branch wiring 323 may be greater than the major axis X11 of the first semiconductor light emitting device 151. In other words, the distance d2 between the second bus wiring 322 and the first-first branch wiring 323 may be larger than the largest major axis X11 among the major axis X11 and X12 of the first to third semiconductor light emitting devices 151, 152 and 153. By increasing the distance d1 between the first bus wiring and the second-first branch wiring 325 or the distance d2 between the second bus wiring 322 and the first-first branch wiring 323, assembly defects can be minimized by ensuring that the first to third semiconductor light emitting devices 151, 152, and 153 are not properly assembled in areas other than the first to third assembly holes 345, 346, and 347.

For example, the distance d3 between the first-first branch wiring 323 and the second-second branch wiring 326 may be greater than the major axis X11 of the first semiconductor light emitting device 151. In other words, the distance d3 between the first-first branch wiring 323 and the second-second branch wiring 326 may be larger than the largest major axis X11 among the major axis X11 and X12 of the first to third semiconductor light emitting devices 151, 152 and 153. By increasing the distance d3 between the first-first branch wiring 323 and the second-second branch wiring 326, assembly defects can be minimized by ensuring that the first to third semiconductor light emitting devices 151, 152, and 153 are not properly assembled in areas other than the first to third assembly holes 345, 346, and 347.

As shown in FIG. 17, it can be seen that the assembly rate is much higher in the embodiment compared to the comparative example. That is, in the comparative example, the width of the assembly wiring across the entire area of the substrate 310 is small, and the voltage applied to the assembly wiring causes a voltage drop due to the large line resistance of the assembly wiring, so that the dielectrophoresis force is less than the set value, so the assembly rate decreases. On the other hand, in the embodiment, the number of assembly wiring was reduced to ⅓ compared to the comparative example, by dramatically widening the width of the first assembly wiring 320_1 and the second assembly wiring 320_2, specifically the first bus wiring 321 and the second bus wiring 322, in an area corresponding to that much, line resistance is minimized, so voltage drop cause by line resistance can be prevented, and the assembly rate can be dramatically improved. For example, as shown in FIG. 17, the assembly rate of the embodiment may be 99.94% or more.

Second Embodiment

FIG. 18 is a cross-sectional view showing a display device according to a second embodiment.

The second embodiment is the same as the first embodiment except for the reflective layers 381, 382, and 383. In the second embodiment, components having the same shape, structure, and/or function as those of the first embodiment are assigned the same reference numerals and detailed descriptions are omitted.

Referring to FIG. 18, the display device 300A according to the second embodiment may include a substrate 310, a first assembly wiring 320_1, a second assembly wiring 320_2, a partition 340, and a first to third semiconductor light emitting device 151, 152 and 153.

The display device 300A according to the second embodiment may include a first insulating layer 330, a second insulating layer 360, a first electrode wiring 371, 373 and 375 and a second electrode wiring 372, 374, 376.

The display device 300A according to the second embodiment may include a third insulating layer 315 and reflective layers 381, 382, and 383.

The reflective layers 381, 382, and 383 may reflect light traveling downward from the first to third semiconductor light emitting devices 151, 152, and 153 toward the upper direction. The reflective layers 381, 382, and 383 may include a metal with excellent reflective properties, such as aluminum (Al) or silver (Ag).

For example, the reflective layers 381, 382, and 383 may be disposed on the substrate 310. For example, the reflective layers 381, 382, and 383 may be disposed between the substrate 310 and the first to third semiconductor layers. Specifically, the first reflective layer 381 is disposed between the substrate 310 and the first semiconductor light emitting device 151, and the first light traveling downward from the first semiconductor light emitting device 151 may be reflected upward. For example, the second reflective layer 382 is disposed between the substrate 310 and the second semiconductor light emitting device 152, and the second light traveling downward from the second semiconductor light emitting device 152 may be reflected upward. For example, the third reflective layer 383 is disposed between the substrate 310 and the third semiconductor light emitting device 153, and the third light traveling downward from the third semiconductor light emitting device 153 may be reflected upward.

An assembly electrode may be disposed between each of the first to third reflective layers 381, 382, and 383 and the first to third semiconductor light emitting devices 151, 152, and 153. In this case, the assembly electrode may be made of a transparent material so that the light generated from each of the first to third semiconductor light emitting devices 151, 152, and 153 can easily reach the reflective layers 381, 382, and 383. For example, the assembly electrode may include a transparent conductive layer. For example, the assembly electrode may include ITO or IZO, etc.

For example, the assembly electrode may be disposed on the first bus wiring 321, the first branch wiring 323 and 324, the second bus wiring 322, and the second branch wiring 325 and 326. This is to prevent the first bus wiring 321, the first branch wiring 323 and 324, second bus wiring 322 and the second branch wiring 325 and 326 from being damaged or removed when forming an assembly electrode made of a transparent material.

For example, the assembly electrode may include a first area located below the assembly hole 345, 346 and 347 and a second area corresponding to the first branch wiring 323 and 324, the second bus wiring 322, and the second branch wiring 325 and 326, respectively. The first area of the assembly electrode may be located between the first to third semiconductor light emitting devices 151, 152 and 153 and the reflective layers 381, 382 and 383. The second area of the assembly electrode may be disposed on the first bus wiring 321, the first branch wiring 323 and 324, the second bus wiring 322, and the second branch wiring 325 and 326.

For example, a width w11 of the first reflective layer 381 may be greater than the distance d1 between the first bus wiring 321 and the second-second branch wiring 326. For example, the width w12 of the second reflective layer 382 may be greater than the distance d4 between the first-second branch wiring 324 and the second-second branch wiring 326. For example, the width w13 of the third reflective layer 383 may be greater than the distance d2 between the second bus wiring 322 and the first-second branch wiring 324. The width w11 of the first reflective layer 381 is greater than the width w13 of the third reflective layer 383, and the width w13 of the third reflective layer 383 may be larger than the width w12 of the second reflective layer 382. In this way, by making the reflective layers 381, 382, and 383 larger, light traveling downward from the first to third semiconductor light emitting devices 151, 152, and 153 is prevented from leaking, thereby improving luminance.

Meanwhile, the third insulating layer 315 may be disposed on the reflective layers 381, 382, and 383. The third insulating layer 315 may insulate the reflective layers 381, 382, and 383 from the first assembly wiring 320_1 and/or the second assembly wiring 320_2 to prevent electrical short circuit.

According to the second embodiment, luminance can be improved by disposing reflective layers 381, 382, and 383 on the lower sides of each of the first to third semiconductor light emitting devices 151, 152, and 153.

As another example, the reflective layers 381, 382, and 383 may be omitted, and the assembly electrode shown in FIG. 18 may be made of a reflective metal such as aluminum (Al), silver (Ag), etc.

Third Embodiment

FIG. 19 is a cross-sectional view showing a display device according to a third embodiment.

In the third embodiment, each of the first to third semiconductor light emitting devices 151, 152, and 153 is a vertical semiconductor light emitting device, and the third embodiment is the same as the first or second embodiments except that one of the first assembly wiring 320_1 and the second assembly wiring 320_2 is used as electrode wiring. In the third embodiment, components having the same shape, structure, and/or function as those of the first or second embodiment are assigned the same reference numerals and detailed descriptions are omitted.

Referring to FIG. 19, the display device 300B according to the third embodiment may include a substrate 310, a first assembly wiring 320_1, a second assembly wiring 320_2, a partition 340, and a first to third semiconductor light emitting devices 151, 152 and 153.

The display device 300B according to the third embodiment may include a first insulating layer 330, a second insulating layer 360, and second electrode wiring 372, 374, and 376.

The first to third semiconductor light emitting devices 151, 152, and 153 may be vertical semiconductor light emitting devices. In a vertical semiconductor light emitting device, a first electrode and a second electrode (not shown) may be disposed below and above the light emitting part (1151, 1152, and 1153 in FIG. 15). Accordingly, in order for the first to third semiconductor light emitting devices 151, 152 and 153 to emit light, electrode wiring must be connected to the lower and upper sides of the first to third semiconductor light emitting devices 151, 152 and 153, respectively.

In the third embodiment, the second assembly wiring 320_2 can be used as electrode wiring for emitting light for the first to third semiconductor light emitting devices 151, 152, and 153. To this end, the first assembly wiring 320_1 and the second assembly wiring 320_2 may be arranged in different layers. For example, the first assembly wiring 320_1 may be disposed below the first insulating layer 330, and the second assembly wiring 320_2 may be disposed above the first insulating layer 330. In this case, the upper surface of the second assembly wiring 320_2 may be exposed to the outside through the first to third assembly holes 345, 346, and 347. That is, when the first to third semiconductor light emitting devices 151, 152 and 153 are placed in the first to third assembly holes 345, 346 and 347, the lower side of the first to third semiconductor light emitting devices 151, 152 and 153, that is, the first electrode, may be electrically connected to the upper surface of the second assembly wiring 320_2. In this case, the second assembly wiring 320_2 is a common wiring and may be grounded, but this is not limited.

As described above in the first and second embodiments, the first assembly wiring 320_1 may include a first bus wiring 321, a first branch wiring 323 and 324, and a first assembly electrode 327a, 328a and 329a, and the second assembly wiring 320_2 may include a second bus wiring 322, second branch wiring 325 and 326, and second assembly electrodes 327b, 328b and 329b. In this case, the lower sides of each of the first to third semiconductor light emitting devices 151, 152, and 153 may be electrically connected to the second assembly electrodes 327b, 328b, and 329b.

Meanwhile, the upper sides of each of the first to third semiconductor light emitting devices 151, 152, and 153 may be electrically connected to electrode wiring 372, 374, and 376.

According to the third embodiment, electrical connection can be facilitated by using vertical semiconductor light emitting devices as the first to third semiconductor light emitting devices 151, 152, and 153.

In addition, according to the third embodiment, by using the second assembly wiring 320_2 used for assembling the first to third semiconductor light emitting devices 151, 152 and 153 to emit light from the first to third semiconductor light emitting devices 151, 152 and 153, it can simplify the structure and improve productivity.

Fourth Embodiment

FIG. 20 is a cross-sectional view showing a display device according to the fourth embodiment.

In the fourth embodiment, each of the first to third semiconductor light emitting devices 151, 152, and 153 is a vertical semiconductor light emitting device, and the fourth embodiment is similar to the first to third embodiments except for the connection electrodes 351, 352, and 353 that electrically connect each side of the first to third semiconductor light emitting devices 151, 152, and 153. In the fourth embodiment, components having the same shape, structure, and/or function as those of the first to third embodiments are assigned the same reference numerals and detailed descriptions are omitted.

Referring to FIG. 20, the display device 300C according to the fourth embodiment may include a substrate 310, a first assembly wiring 320_1, a second assembly wiring 320_2, a partition 340, and a first to a third semiconductor light emitting device 151, 152 and 153.

The display device 300C according to the fourth embodiment may include a first insulating layer 330, a second insulating layer 360, and second electrode wiring 372, 374, and 376.

The display device 300C according to the fourth embodiment may include connection electrodes 351, 352, and 353.

The connection electrodes 351, 352, and 353 may be disposed within the assembly holes 345, 346, and 347. That is, the first connection electrode 351 may be disposed along the perimeter of the first semiconductor light emitting device 151 within the first assembly hole 345. The second connection electrode 352 may be disposed along the perimeter of the second semiconductor "T-light device" within the second assembly hole 346. The third connection electrode 353 may be disposed along the perimeter of the third semiconductor light emitting device 153 within the third assembly hole 347.

One side of the connection electrodes 351, 352, and 353 is connected to the first assembly wiring 320_1 or the second assembly wiring 320_2 through the first insulating layer 330, and another side may be connected to each side of the first to third semiconductor light emitting devices 151, 152, and 153.

For example, one side of the first connection electrode 351 is connected to the upper surface of each of the first-first assembly electrode 327a and the second-first assembly electrode 327b through the first insulating layer 330, and another side may be connected to the side of the first semiconductor light emitting device 151. Additionally, the first electrode wiring 372 may be connected to the upper side of the first semiconductor light emitting device 151. Accordingly, a first light may be generated in the first semiconductor light emitting device 151 by the first voltage applied to the first-first assembly electrode 327a, the second-first assembly electrode 327b, and the first electrode wiring.

For example, one side of the second connection electrode 352 is connected to the upper surface of each of the first-second assembly electrode 328a and the second-second assembly electrode 328b through the first insulating layer 330, and another side may be connected to the side of the second semiconductor light emitting device 152. Additionally, the second electrode wiring 374 may be connected to the upper side of the second semiconductor light emitting device 152. Accordingly, a second light may be generated in the second semiconductor light emitting device 152 by the second voltage applied to the first-second assembly electrode 328a, the second-second assembly electrode 328b, and the second electrode wiring.

For example, one side of the third connection electrode 353 is connected to the upper surface of each of the 1-3 assembly electrode 329a and the 2-3 assembly electrode 329b through the first insulating layer 330, and another side may be connected to the side of the third semiconductor light emitting device 153. Additionally, the third electrode wiring 376 may be connected to the upper side of the third semiconductor light emitting device 153. Accordingly, a third light may be generated in the third semiconductor light emitting device 153 by the third voltage applied to the 1-3 assembly electrode 329a and the 2-3 assembly electrode 329b and the third electrode wiring.

For example, the first light is red light, the second light is green light, and the third light is blue light, and colored light can be obtained by mixing these lights.

According to the fourth embodiment, by arranging connection electrodes along the circumference of each of the first to third semiconductor light emitting devices 151, 152, and 153, for each sub-pixel PX1*l*, PX12, PX13, PX21, PX22 and PX23, the contact area between each side and the connection electrode of the first to third semiconductor light emitting devices 151, 152 and 153 is the same, so image quality can be improved by preventing luminance unevenness between sub-pixels PX11, PX12, PX13, PX21, PX22 and PX23.

Fifth Embodiment

FIG. 21 is a cross-sectional view showing a display device according to the fifth embodiment.

The fifth embodiment is the same as the first to fourth embodiments except for the first assembly wiring 320_1 and the second assembly wiring 320_2. In the fifth embodiment, components having the same shape, structure, and/or function as those of the first to fourth embodiments are assigned the same reference numerals and detailed descriptions are omitted.

As shown in FIG. 21, the display device 300D according to the fifth embodiment may include a first assembly wiring 320_1 and a second assembly wiring 320_2.

For example, the first assembly wiring 320_1 may include a first bus wiring 321, a plurality of first branch wiring 323 and 324, and a plurality of first assembly electrodes 327a, 328a and 329a. For example, the second assembly wiring 320_2 may include a second bus wiring 322, a plurality of second branch wirings 325 and 326, and a plurality of second assembly electrodes 327b, 328b, and 329b.

For example, the first branch wiring may include the first-first branch wiring 323 and the first-second branch wiring 324. For example, the first-first branch wiring 323 and the first-second branch wiring 324 may be arranged for each pixel 301, 302, and 303. For example, the first-first branch wiring 323 may be arranged along a first direction on the first side of the first bus wiring 321 arranged along the second direction in the pixels 301, 302, and 303. The first-second branch wiring 324 may be arranged along a first direction on the second side of the first bus wiring 321 arranged along the second direction in the pixels 301, 302, and 303. For example, the first-first branch wiring 323 and the first-second branch wiring 324 may be arranged parallel to each other along the first direction. Here, the pixels 301, 302, and 303 may be light-emitting pixels PX11, PX12, and PX13 or dummy pixels PX21, PX22, and PX23.

The second branch wiring 325 and 326 may be arranged between the first-first branch wiring 323 and the first-second branch wiring 324 in the pixels 301, 302 and 303. For example, the second branch wiring 325 and 326 may be arranged adjacent to the first-first branch wiring 323 in the pixels 301, 302 and 303. For example, the second branch wiring 325 and 326 may be arranged parallel to the first-first branch wiring 323 along the first direction in the pixels 301, 302 and 303. For example, the second branch wiring 325 and 326 may be arranged adjacent to the first-second branch wiring 324 in the pixels 301, 302 and 303. For example, the second branch wiring 325 and 326 may be arranged parallel to the first-second branch wiring 324 along the first direction in the pixels 301, 302 and 303.

For example, the first assembly electrodes 327a, 328a and 329a and the second assembly electrodes 327b, 328b and 329b may be disposed between the first-first branch wiring 323 and the second branch wiring 325 and 326. For example, the first assembly electrodes 327a, 328a and 329a and the second assembly electrodes 327b, 328b and 329b may be disposed between the first-second branch wiring 324 and the second branch wiring 325 and 326.

For example, each of the first-first assembly electrode 327a, the first-second assembly electrode 328a, and the 1st-3rd assembly electrode 329a may be branched from the first-first branch wiring 323. For example, each of the second-first assembly electrode 327b, the second-second assembly electrode 328b and the second-third assembly electrode 329b may branch from one side of the second branch wiring toward the first-first branch wiring 323. In this case, the first assembly hole 345 is disposed on the first-first assembly electrode 327a and the second-first assembly electrode 327b, the second assembly hole 346 is disposed on the first-second assembly electrode 328a and the second-second assembly electrode 328b, and the third assembly hole 347 may be disposed on the 1-3 assembly electrode 329a and the 2-3 assembly electrode 329b. The first assembly hole 345, the second assembly hole 346, and the third assembly hole 347 may be located in the light emitting pixels PX11, PX12, and PX13. A first semiconductor light emitting device 151 is disposed in the first assembly hole 345, a second semiconductor light emitting device 152 is disposed in the second assembly hole 346, and a third semiconductor light emitting device 153 may be placed in the third assembly hole 347.

For example, each of the first-first assembly electrode 327a, the first-second assembly electrode 328a, and the 1-3 assembly electrode 329a may be branched from the first-second branch wiring 324. For example, each of second-first assembly electrode 327b, the second-second assembly electrode 328b and the second-third assembly electrode 329b may branch from another side of the second branch wiring toward the first-second branch wiring 324. In this case, the first assembly hole 345 is disposed on the first-first assembly electrode 327a and the second-first assembly electrode 327b, the second assembly hole 346 is disposed on the first-second assembly electrode 328a and the second-second assembly electrode 328b, and the third assembly hole 347 may be disposed on the 1-3 assembly electrode 329a and the 2-3 assembly electrode 329b. The first assembly hole 345, the second assembly hole 346, and the third assembly hole 347 may be located in the dummy pixels PX21, PX22, and PX23. A first semiconductor light emitting device 151 is disposed in the first assembly hole 345, a second semiconductor light emitting device 152 is disposed in the second assembly hole 346, and a third semiconductor light emitting device 153 may be placed in the third assembly hole 347.

According to the fifth embodiment, by providing only the first branch wiring 323 and 324 and the second branch wiring 325 and 326 branched once from the first bus wiring 321 and the second bus wiring 322, the layout of the first branch wiring 323 and 324 and the second branch wiring 325 and 326 can be simpler.

In addition, according to the fifth embodiment, the distance between the first branch wiring 323 and 324 and the second branch wiring 325 and 326 becomes further apart, and in areas other than the first to third assembly holes 345, 346 and 347, the dielectrophoretic force between the first branch wiring 323 and 324 and the second branch wiring 325 and 326 is minimized, so assembly defects can be minimized by ensuring that the first to third semiconductor light emitting devices 151, 152, and 153 are not properly assembled in areas other than the first to third assembly holes 345, 346, and 347.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

INDUSTRIAL APPLICABILITY

The embodiment may be adopted in the field of displays that display images or information.

The embodiment may be adopted in the field of displays that display images or information using a semiconductor light emitting device. The semiconductor light emitting device may be a micro-level semiconductor light emitting device or a nano-level semiconductor light emitting device.

The invention claimed is:

1. A display device, comprising:
   a substrate including a plurality of pixels, each of the plurality of pixels including a first to third sub-pixels;
   a first assembly wiring on the substrate;
   a second assembly wiring on the substrate;
   a partition having a first to third assembly holes in the first to third sub-pixels of each of the plurality of pixels; and
   a first to third semiconductor light emitting devices;
   wherein the first assembly wiring comprises a first bus wiring a plurality of first branch wirings branched from the first bus wiring, and a plurality of first assembly electrodes branched from each of the plurality of first branch wirings,
   wherein the second assembly wiring comprises a second bus wiring, and a plurality of second branch wirings branched from the second bus wiring,
   wherein each of the first to third semiconductor light emitting devices is disposed in the first to third assembly holes between the first bus wiring, the second bus wiring, a first branch wiring of the plurality of first branch wirings, and a second branch wiring of the plurality of second branch wirings,
   wherein each of the first assembly electrodes is branched from the first bus wiring, and
   wherein one of the first to third semiconductor light emitting devices is disposed on the first assembly wiring branched from the first bus wiring and a second assembly electrode branched from the second branch wiring.

2. The display device according to claim 1, wherein the second assembly wiring comprises a plurality of second assembly electrodes branched from each of the plurality of second branch wirings and facing the plurality of first assembly electrodes, and
   wherein each of the first to third semiconductor light emitting devices is disposed in the first to third assembly holes on a first assembly electrode of the plurality of first assembly electrodes and the second assembly electrode.

3. The display device according to claim 1, wherein the second assembly electrode is branched from the second bus wiring, and
   wherein another semiconductor light emitting device among the first to third semiconductor light emitting devices is disposed on a first assembly electrode of the plurality of first assembly electrodes branched from the first branch wiring and a second assembly electrode branched from the second bus wiring.

4. The display device according to claim 1, wherein a width of the first bus wiring is greater than a width of a first assembly electrode of the plurality of first assembly electrodes, and
   wherein a width of the second bus wiring is greater than a width of the second assembly electrode.

5. The display device according to claim 1, wherein the first to third semiconductor light emitting devices comprise a red semiconductor light emitting device, a green semiconductor light emitting device, and a blue semiconductor light emitting device.

6. The display device according to claim 1, wherein the first bus wiring and the second bus wiring are arranged side by side.

7. The display device according to claim 1, wherein the first branch wiring and the second branch wiring are arranged side by side.

8. A display device, comprising:
   a substrate including a plurality of pixels, each of the plurality of pixels including a first to third sub-pixels;
   a first assembly wiring on the substrate;
   a second assembly wiring on the substrate;
   a partition having a first to third assembly holes in the first to third sub-pixels of each of the plurality of pixels; and
   a first to third semiconductor light emitting devices;
   wherein the first assembly wiring comprises a first bus wiring, and a plurality of first branch wirings branched from the first bus wiring,
   wherein the second assembly wiring comprises a second bus wiring, and a plurality of second branch wirings branched from the second bus wiring,
   wherein each of the first to third semiconductor light emitting devices is disposed in the first to third assembly holes between the first bus wiring, the second bus wiring, a first branch wiring of the plurality of first branch wirings, and a second branch wiring of the plurality of second branch wirings, and
   wherein the first branch wiring comprises a first-first branch wiring branched from the first bus wiring, and a plurality of first-second branch wirings branched from the first-first branch wiring.

9. The display device according to claim 8, wherein the plurality of pixels comprise a first pixel and a second pixel adjacent to each other,
   wherein one of the first-second branch wiring of the plurality of the first-second branch wiring is disposed in the first pixel, and
   wherein another first-second branch wiring of the plurality of the first-second branch wiring is disposed in the second pixel.

10. The display device according to claim 9, wherein the second branch wiring comprises a second-first branch wiring branched from the second bus wiring, and a plurality of second-second branch wirings branched from the second-first branch wiring.

11. The display device according to claim 10, wherein the plurality of pixels comprise a third pixel adjacent to the second pixel,
- wherein one of second-second branch wiring of the plurality of second-second branch wirings is disposed in the second pixel, and
- wherein another second-second branch wiring of the plurality of second-second branch wirings is disposed in the third pixel.

12. The display device according to claim 10, wherein a width of the first bus wiring is greater than a width of the first-first branch wiring, and
- wherein a width of the second bus wiring is greater than a width of the first-first branch wiring.

13. The display device according to claim 10, wherein a width of the first bus wiring and a width of the second bus wiring are the same, and
- wherein a width of the first-first branch wiring and a width of the branch wiring are the same.

14. The display device according to claim 10, wherein a distance between the first-first branch wiring and a second-second branch wiring of the plurality of second-second branch wirings is greater than a width of the first-first branch wiring.

15. The display device according to claim 10, wherein at least one semiconductor light emitting device among the first to third semiconductor light emitting devices are configured to have a minor axis and a major axis, and
- wherein a distance between the first bus wiring and the second-first branch wiring is greater than a length of the major axis of the at least one semiconductor light emitting device.

16. The display device according to claim 15, wherein a distance between the second bus wiring and the first-first branch wiring is greater than the length of the major axis of the at least one semiconductor light emitting device.

17. The display device according to claim 15, wherein a distance between the first-first branch wiring and a second-second branch wiring of the plurality of second-second branch wirings is greater than the length of the major axis of the at least one semiconductor light emitting device.

* * * * *